United States Patent
Jang et al.

(10) Patent No.: US 7,016,926 B2
(45) Date of Patent: Mar. 21, 2006

(54) LOW POWER CSD LINEAR PHASE FIR FILTER ARCHITECTURE USING VERTICAL COMMON SUBEXPRESSION AND FILTER DESIGN METHOD THEREFOR

(75) Inventors: Young-Beom Jang, Seoul (KR); Se-Jung Yang, Seoul (KR)

(73) Assignee: Samsung Electronics Co., Ltd., Suwon-Si (KP)

( * ) Notice: Subject to any disclaimer, the term of this patent is extended or adjusted under 35 U.S.C. 154(b) by 623 days.

(21) Appl. No.: 10/140,591

(22) Filed: May 7, 2002

(65) Prior Publication Data

US 2003/0105787 A1 Jun. 5, 2003

(30) Foreign Application Priority Data

Nov. 12, 2001 (KR) ................. 2001-70065

(51) Int. Cl.
*G06F 17/10* (2006.01)
(52) U.S. Cl. .................................... 708/319
(58) Field of Classification Search ................ 708/319
See application file for complete search history.

(56) References Cited

U.S. PATENT DOCUMENTS

| | | | | | |
|---|---|---|---|---|---|
| 5,058,047 | A | * | 10/1991 | Chung | 708/322 |
| 5,831,880 | A | * | 11/1998 | Lee | 708/319 |
| 6,163,788 | A | * | 12/2000 | Chen et al. | 708/319 |
| 6,678,709 | B1 | * | 1/2004 | Gandhi et al. | 708/319 |
| 6,757,326 | B1 | * | 6/2004 | Prieto et al. | 375/232 |
| 2002/0152251 | A1 | * | 10/2002 | Jang | 708/319 |

* cited by examiner

*Primary Examiner*—D. H. Malzahn
(74) *Attorney, Agent, or Firm*—F.Chau & Associates,LLC

(57) ABSTRACT

A method for implementing a low power and high-speed digital filter having reduced number of adders is disclosed. The method comprises the steps of determining vertical common CSD (Canonical Signed Digit) code words between corresponding CSD code words of adjacent filter coefficients, wherein a vertical common CSD code word in a highest level bit is set as a vertical common subexpression, expressing the vertical common CSD code words out of the CSD code words of each filter coefficient with the vertical common subexpression by shifting and delaying the vertical common subexpression, and synthesizing the expressed vertical common CSD code words of the filter coefficients.

18 Claims, 14 Drawing Sheets

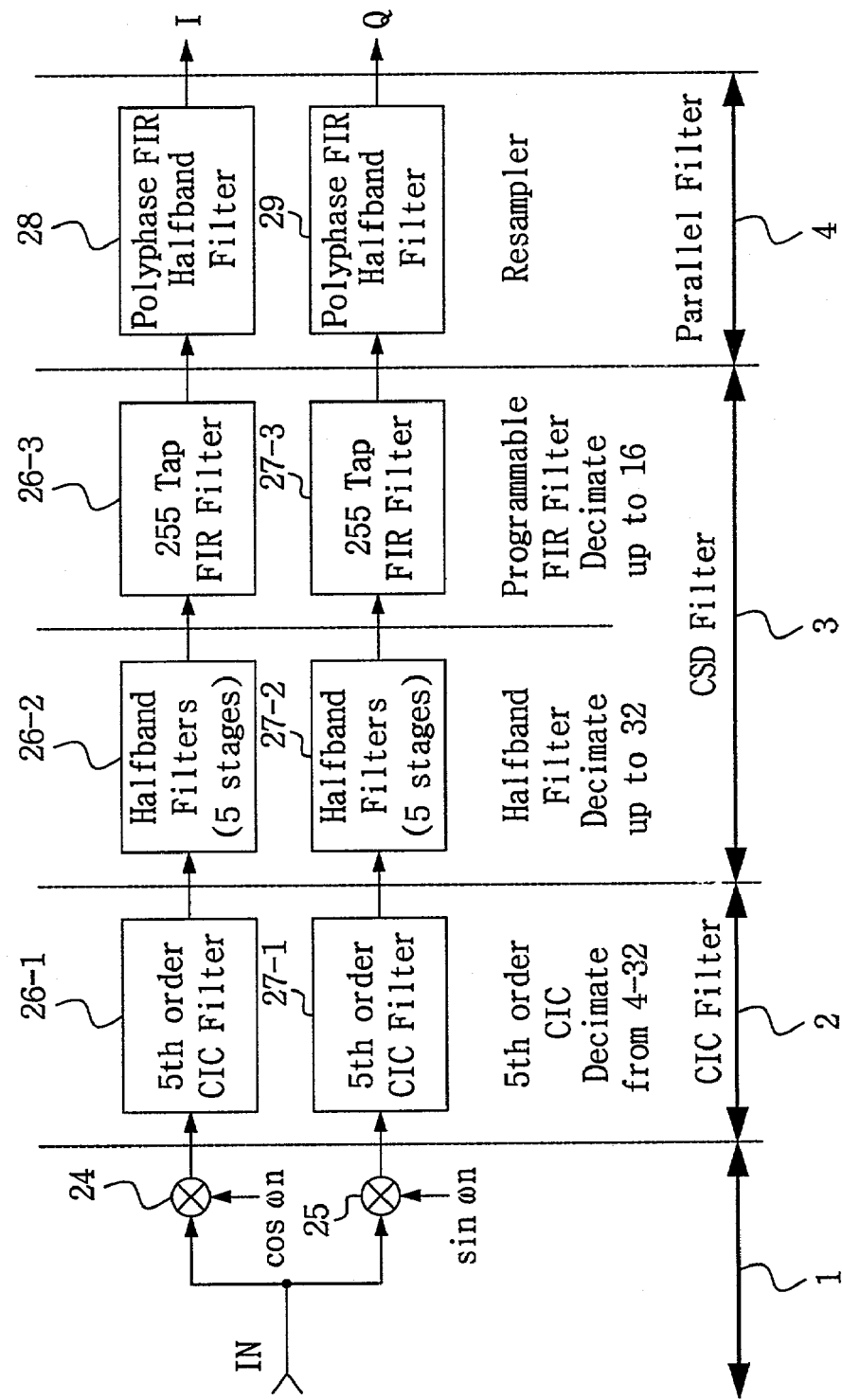

LOW POWER CSD LINEAR PHASE FIR FILTER ARCHITECTURE USING VERTICAL COMMON SUBEXPRESSION AND FILTER DESIGN METHOD THEREFOR

CROSS-REFERENCE TO RELATED APPLICATION

This application claims priority to Korean Patent Application No. 2001-70065 filed on Nov. 12, 2001.

BACKGROUND

1. Technical Field

The present invention relates to a digital filter, and more particularly, to low-power CSD (Canonical Signed Digit) linear phase FIR filter architectures using vertical common subexpressions and filter design methods therefor.

2. Description of Related Art

A mobile radio communications system such as a cellular phone requires a low-power and high-speed linear phase Finite Impulse Response (FIR) filter using CMOS techniques. Currently, such low power and high speed FIR filters are designed using CSD type coefficients as filter coefficients. CSD type coefficients are expressed as binary digits subtracting 1 from 2's complement type coefficients.

Intermediate frequency (IF) processing terminals of wireless transceivers such as Digital Frequency Down Converter (DFDC) require a high-speed decimation filter. It is preferred that the high-speed/low power filter performs a multiplication using only adders (including subtracter) and delay devices. The high-speed/low power filter can perform the multiplication more efficiently with the CSD type coefficients. The CSD type coefficients are expressed using the following formula:

$$\sum_{i=0}^{N-1} ai 2^{-i}$$

wherein the numbers $a_0, a_1, a_2, \ldots, a_{N-1}$ are 2's complement type coefficients if $a_0=0$ or $-1$ and $a_i=0$ or 1 when $i>0$. The numbers $b_0, b_1, b_2, \ldots, b_{N-1}$ are the CSD type coefficients if each $b_i$ 0, +1, −1 and no two consecutive $b_i$ are nonzero.

Technically, the CSD type coefficients are expressed by subtracting 2's complement type coefficients from "1". For example, if the 2's complement type coefficient is "01111", the CSD type coefficient can be expressed as "1−00001". Hereinafter, "−1" is expressed as "n" for convenience. That is, when "−1" is expressed as "n", the 2's complement type coefficient "01111" is expressed as a CSD type coefficient "1000n". In such a way, all the 2's complement type coefficients are easily converted into CSD type coefficients.

Since none of the CSD type coefficients has more than (N+1)/2 nonzero bits, as compared with the 2's complement type coefficients, a filter that performs a multiplication using an adder will require a reduced number of adders in using the CSD type coefficients as filter coefficients. The multiplication for filter coefficients is performed using adders and shifts. Because the cost for the filter can be reduced by designing the shift as hard-wired logic, it is desirable to reduce the number of adders to reduce the cost for the filter.

Table 1 lists 4-bit filter coefficients expressed as 2's complement type digits and corresponding CSD type digits.

As shown in Table 1, the 2's complement type coefficients have 32 digits "1" and the CSD type coefficients have 23 digits "1". That is, the CSD type coefficients has the number of digits "1" less than in the 2' complement type coefficients by 9 digits "1".

TABLE 1

| | CSD code creation | | | | | | | |
|---|---|---|---|---|---|---|---|---|
| Number | 2's complement | | | | CSD type | | | |
| 0.875 | 0 | 1 | 1 | 1 | 1 | 0 | 0 | n |
| 0.75 | 0 | 1 | 1 | 0 | 1 | 0 | n | 0 |
| 0.625 | 0 | 1 | 0 | 1 | 0 | 1 | 0 | 1 |
| 0.5 | 0 | 1 | 0 | 0 | 0 | 1 | 0 | 0 |
| 0.375 | 0 | 0 | 1 | 1 | 0 | 1 | 0 | n |
| 0.25 | 0 | 0 | 1 | 0 | 0 | 0 | 1 | 0 |
| 0.125 | 0 | 0 | 0 | 1 | 0 | 0 | 0 | 1 |
| 0 | 0 | 0 | 0 | 0 | 0 | 0 | 0 | 0 |
| −0.125 | 1 | 1 | 1 | 1 | 0 | 0 | 0 | n |
| −0.25 | 1 | 1 | 1 | 0 | 0 | 0 | n | 0 |
| −0.375 | 1 | 1 | 0 | 1 | 0 | n | 0 | 1 |
| −0.5 | 1 | 1 | 0 | 0 | 0 | n | 0 | 0 |
| −0.625 | 1 | 0 | 1 | 1 | 0 | n | 0 | n |
| −0.75 | 1 | 0 | 1 | 0 | n | 0 | 1 | 0 |
| −0.875 | 1 | 0 | 0 | 1 | n | 0 | 0 | 1 |
| −1 | 1 | 0 | 0 | 0 | n | 0 | 0 | 0 |

Table 2 shows CSD type coefficients of a linear phase FIR filter having 11 taps.

When the total number of digits "1" or digits "n" is m, the number of (m−1) adders are needed to implement the coefficients. In Table 2, since m=17, 16 adders are needed to implement the coefficients. The number of adders can be reduced by designing a linear phase FIR filter with a common subexpression method. In Table 2, each of the coefficients $h_0, h_1, h_2, h_3, h_4$ is symmetric to each of the coefficients $h_{10}, h_9, h_8, h_7, h_6$, so that the linear phase FIR filter has two common subexpressions.

TABLE 2

| CSD coefficients of 11-tap linear phase FIR filter | | | | | | | | | |
|---|---|---|---|---|---|---|---|---|---|
| | $2^{-1}$ | $2^{-2}$ | $2^{-3}$ | $2^{-4}$ | $2^{-5}$ | $2^{-6}$ | $2^{-7}$ | $2^{-8}$ | $2^{-9}$ |
| h0 | | | | | | | | | 1 |
| h1 | | | | | | | n | | n |
| h2 | | | n | | | 1 | | | |
| h3 | | n | | 1 | | | | | |
| h4 | | 1 | | | | | | | |
| h5 | 1 | | | | | | | | |
| h6 | | 1 | | | | | | | |
| h7 | | n | | 1 | | | | | |
| h8 | | | n | | | 1 | | | |
| h9 | | | | | | | n | | n |
| h10 | | | | | | | | | 1 |

In Table 2, a digit "0" is omitted. An output signal (y) of the FIR filter is expressed by a following formula y [n]:

$$\sum_{i=0}^{N-1}\sum_{j=0}^{M-1} aij(xn-1 >> j) = \sum_{i=0}^{N-1}\sum_{j=0}^{M-1} a_{ij} Xij$$

wherein since $a_{ij}$ has digits "1, 0, or −1", the output signal is expressed as the sum of various shifted and delayed versions of input signals (x). Each row $X_{ij}$ indicates "delay" of the input signal (x) and each column $X_{ij}$ indicates "shift" of the input signal (x). An entry ±1 in a row i and a column j is represented as $\pm x_1 [-i] >> j$, and a first row (h0) and a first column ($2^{\wedge}-1$) are defined by "x1" without i and j and determined as a reference point. Here, ($2^{\wedge}-1$) indicates −1 multiplication of 2 (i.e., $2^{-1}=0.5$) and ($2^{\wedge}-2$) indicates −2 multiplication of 2 (i.e., $2^{-2}$).

Alternatively, the linear phase FIR filter in Table 2 may be designed using a conventional horizontal common subexpression sharing method to reduce the number of adders. As shown in Table 2, the number of common subexpressions for "n0n", "n001" and "n01" is two. Each of the horizontal common subexpressions can be implemented as follows.

$x_2 = -x_1 - x_1 >> 2$: a first common subexpression
$x_3 = -x_1 + x_1 >> 3$: a second common subexpression
$x_4 = -x_1 + x_1 >> 2$: a third common subexpression wherein, $x_2$ indicates a common subexpression of "n0n", $x_3$ indicates a common subexpression of "n001" and $x_4$ indicates a common subexpression of "n01". The symbol ">>" denotes "shift" of the input signal (x) in a lowest level bit (LSB) direction. For example, if the common subexpression is "n0n" and x=1, a highest level bit (MSB) out of n0n is "$-x_1$", the LSB' out of n0n is $-x_1$ shifted to a right direction by 2 bits, so that "n0n" is expressed as the sum of the results, i.e., "$-_1-x_1>>2$". Thus, $x_2$ is defined as a horizontal common subexpression of "n0n". Similar to the common subexpression for "n0n" the horizontal common subexpression for "n001" is defined as "$x_3$", i.e., "$-x_1+x_1>>3$".

As shown in the formulas, 3 adders are needed to implement three common subexpressions. The output signal (y) of the filter using the horizontal common subexpression sharing method is expressed by following equation.

$$y=x_1>>8+x_2[-1]>>6+x_3[-2]>>3+x_4[-3]>>1+x_1[-4]$$
$$>>1+x_1[-5]+x_1[-6]>>1+x_4[-7]>>1+x_3[-8]>>3+$$
$$x_2[-9]>>6+x_1[-10]>>8$$

wherein, "$x_1>>8$" indicates "1" in a first row (h0) and a ninth column ($2^{\wedge}-9$) in Table 2. It means that "$x_1=1$" is 8-bit-shifted to a right direction. The numeral "1" in the first row (h0) and ninth column ($2^{\wedge}-9$) is not implemented using a horizontal common subexpression. The formula, "$x_2[-1]>>6$" means that the first horizontal common subexpression "$x_2$" is delayed to a vertical direction by one clock cycle (i.e., 1 tap) and shifted to a right direction by 6 bits. For example, in Table 2, if "n0n" located at a cross point of the first row (h0) and the first, second and third columns ($2^{\wedge}-1$, $2^{\wedge}-2$, $2^{\wedge}-3$) is expressed as "$x_2$", "n0n" located at a cross point of the second row and the seventh, eight and ninth columns ($2^{\wedge}-7$, $2^{\wedge}-8$, $2^{\wedge}-9$) is delayed and shifted "$x_2$" (that is delayed to a vertical direction by "1" and shifted to a right direction by 6 bits).

In the above formula, since 10 additions are needed to obtain the output signal (y) and 3 additions are needed to implement 3 horizontal common subexpressions (n0n, n001, n01), 13 adders are needed to implement the filter in Table 2. The filter has a configuration of FIG. 1, when it is implemented using a Transposed Direct Form.

Referring to FIG. 1, symbol Ai ("i" is a natural number greater than 1) indicates adders connected to tap lines T1 through T6, symbol Di indicates delayers, x indicates an input signal, and y indicates an output signal. Numerals next to the tap lines indicate the number of bits to be shifted. For example, the numeral "9" next to the tap line T1 indicates that a digital input signal (x) to be filtered is shifted to a LSB direction by 9 bits. Shift registers are employed in the configuration of FIG. 1 to perform a multiplication by shifting the input signals in response to clock signals. The adders Ai having a symbol "−" at input terminals thereof perform negative additions, i.e., subtracts. It should be noted that the term "adder" used in this disclosure includes the addition function for performing positive addition as well as the subtraction for performing negative addition.

Referring again to FIG. 1, since the input signal (x) that is shifted by 9 bits is applied on the tap line T1, the coefficient h0 in Table 2 is implemented on the tap line T1. That is, "$x_1>>8$" is implemented using a shift register. The horizontal common subexpression $x_2$ is calculated by the shift registers, each register shifting the input signal (x) by 1 and 3, and the adder A1 connected to the line T2. The "$x_2[-1]>>6$" is implemented by the adder A4 that adds up the output (that is shifted by 6 bits) of the shift register connected to the tap line T2 and the output of the delayer D1 (that delays the output of the tap line T1 by one clock cycle). In addition, the adder A12 implements "$x_{2[-9]>>6}$", the adder A5 implements "$x_3[-2]>>3$", and the adder A11 implements "$x_3[-8]>>3$".

The configuration of FIG. 1 multiplies the input signal (x) by 9 via the shift register, prior to performing addition operations, so that "−n" in FIG. 1 is implemented by a shift register hardware. Each of the delayers D1 through D10 delays the output of the adder inputted to the input terminal thereof by a predetermined time in order to obtain the output signal (y). The reason the coefficient h0 is implemented to −1, −4 and −7 is that since $x_1$ is a reference point shifted by −1, $x_1$ should be once more shifted by −1 than in the implementing formula when $x_1$ is implemented.

An example of a common subexpression sharing method for reducing the number of adders in a Canonical Signed Digit (CSD) FIR filter is disclosed by Richard I. Hartley, "Subexpression sharing in filters using canonic signed digit multipliers", IEEE Transaction on circuits and systems II: Analog and digital signal processing, Vol. 43, No. 10, pp. 677–688, October 1996.

Further, an example of techniques concerning a filter design architecture using a mixed integer programming (MILP) and a high-speed FIR digital filter structure using minimum numbers of adders is disclosed by M. Yagyu, A. Nishihara and N. Fujii, "Fast FIR digital filter structures using minimal number of adders and its application to filter design", IEICE Transaction on Fundamentals, Vol. E79 A, No. 8, pp. 1120–1129, August 1996.

The conventional methods reduce the number of adders by searching and sharing common subexpressions in coefficients but symmetric common subexpressions of linear phase filter coefficients. However, there is a problem in that the reduced number of adders is not sufficient to implement a high-speed and low-power semiconductor chip.

As described above, the conventional linear phase CSD filter employs only the horizontal common subexpressions, because it is advantage to use common subexpressions naturally generated at both sides thereof due to the symmetric structures of the filters. However, the conventional horizontal common subexpressions sharing method is not adequate to be used in high-speed and low power filters, because the method still requires relatively large numbers of adders.

Thus, a need exists to minimize the number of adders in a linear phase CSD filter, to thereby provided reduced size of semiconductor design as well as improved processing speed.

SUMMARY OF THE INVENTION

It is an object of the present invention to provide a low-power and high-speed CSD linear phase filter architecture and a filter coefficient design method therefor.

It is another object of the present invention to provide a low-power and high-speed linear phase filter incorporated in a semiconductor chip in which its occupying area is minimized and simplified.

It is another object of the present invention to provide a low-power and high-speed digital filter and a filter design method therefore capable of decreasing a manufacturing cost.

It is further object of the present invention to provide a method for reducing the number of adders implemented in a linear phase filter by using vertical common subexpressions.

According to one aspect of the present invention, a method is provided to implement filter coefficients in a linear phase digital filter in which CSD (Canonical Signed Digit) filter coefficients are used as filter coefficients, and the CSD filter coefficient are expressed with CSD code words in a predetermined number of bits. The method comprises the steps of determining vertical common CSD code words between corresponding CSD code words of adjacent filter coefficients, wherein a vertical common CSD code word in a highest level bit is set as a vertical common subexpression, expressing the vertical common CSD code words out of the CSD code words of each filter coefficient with the vertical common subexpression by shifting and delaying the vertical common subexpression, and synthesizing the expressed vertical common CSD code words of the filter coefficients.

According to another aspect of the present invention, a method is provided to implement a digital filter comprising filter coefficients expressed with CSD (Canonical Signed Digit) code words of n bits (n is a natural number greater than or equal to 2) for filtering digital samples of k bits (k is a natural number greater than or equal to 4). The method comprises the steps of generating a vertical common subexpression by searching vertical common CSD code words between corresponding CSD code words of adjacent filter coefficients and determining a vertical common CSD code word in a highest-level bit of the vertical common CSD code words as the vertical common subexpression, and converting the vertical common CSD code words out of each filter coefficient to a shifted and delayed vertical common subexpression such that the filter coefficients are synthetically implemented.

According to another aspect of the present invention, a linear phase digital filter using CSD (Canonical Signed Digit) filter coefficients expressed with CSD code words of a given number of bits as filter coefficients at taps of delay lines comprises a vertical common subexpression generator, connected to a data input terminal, for setting a vertical common CSD code word in a highest level bit of vertical common CSD code words if corresponding CSD code words of adjacent filter coefficients have a plurality of the vertical common CSD code words as a vertical common subexpression, a shift register comprising a plurality of shifters commonly connected to an output terminal of the vertical common subexpression generator, each shifter shifting the output of the vertical common subexpression generator by a predetermined number of bits different from each other, a plurality of adders, each adder being connected to one of the shifters, and a plurality of delayers, each delayer being alternatively connected to an output terminal of corresponding adder of the adders and for delaying the output of the corresponding adder by a unit time.

According to another aspect of the present invention, a linear phase digital filter in which CSD (Canonical Signed Digit) filter coefficients expressed with CSD code words of a predetermined number of bits are used as filter coefficients at taps of delay lines comprises a plurality of vertical common subexpression generators, connected to a plurality of data input terminals respectively, for setting a highest-level bit of vertical common CSD code words of adjacent filter coefficients as vertical common subexpression, respectively, a plurality of shift registers, each shift register being commonly connected to an output terminal of corresponding one of the vertical common subexpression generators and comprising a plurality of output terminals for shifting and outputting an output of the corresponding vertical common subexpression generator by a predetermined number of bits different from each other, a plurality of adders connected to the plurality of output terminals of the shift registers, respectively, and a plurality of delayers alternatively connected to the adders and for delaying the output of the adders by a unit time, respectively.

According to further aspect of the present invention, a CSD (Canonical Signed Digit) type digital filter in which filter coefficients comprises CSD filter coefficients expressed with CSD code words of a predetermined number of bits comprises a vertical common subexpression generator comprising a delay member and an addition member connected to a data input terminal to assign a vertical common subexpression to a highest-level bit of vertical common CSD code words of adjacent filter coefficients, a shift register, commonly connected to an output terminal of the addition member of the vertical common subexpression generator, comprising a plurality of output terminals for sequentially shifting and outputting an output of the addition member by a predetermined number of bits in order of a lowest level of bit, an addition circuit comprising a plurality of input terminals connected to the output terminals of the shift register, respectively, and a delay circuit comprising a plurality of delayers alternatively connected to the input terminals of the addition circuit for delaying the output of the addition circuit by a unit time, respectively.

Advantageously, since filter coefficients according to one aspect of the present invention are implemented using vertical common subexpressions, the number of adders for implementing a digital filter is minimized thereby forming a high-speed and low-power digital filter.

These and other aspects, factors, and advantages of the present invention will become apparent from the following detailed description of preferred embodiments, which is to be read in conjunction with the accompanying figures.

BRIEF DESCRIPTION OF THE DRAWINGS

FIG. 8 is a block diagram illustrating an exemplary intermediate-frequency processor of the wireless receiver terminal of FIG. 7.

DETAILED DESCRIPTION OF PREFERRED EMBODIMENTS

Figure 1:
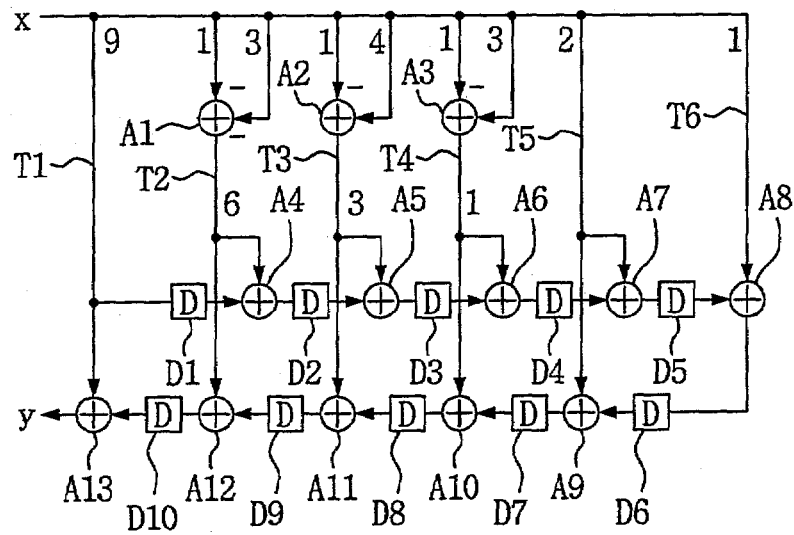
FIG. 1 is a circuit diagram of a CSD linear phase filter implemented according to a conventional horizontal common subexpression method.

The present invention will be described more fully hereinafter with reference to the accompanying drawings in which preferred embodiments of the invention are shown, wherein similar reference numerals denote elements having the same or similar functions.

In preferred embodiments of the present invention, filter coefficients to be processed are implemented using a vertical common subexpression. It is preferable to use full adders having a plurality input terminals except for where the adders are used in first input terminals of a filter. The full adder comprises two half adders and one OR gate. The half adder comprises one exclusive OR gate and one AND gate. A delayer may be configured with flip-flop or register.

Table 3 shows filter coefficients grouped in a vertical direction according to the present invention (which is to be contrasted with Table 2 in which the filter coefficients are grouped in a horizontal direction).

TABLE 3

CSD coefficients of 11 taps linear phase FIR filter

|     | $2^{-1}$ | $2^{-2}$ | $2^{-3}$ | $2^{-4}$ | $2^{-5}$ | $2^{-6}$ | $2^{-7}$ | $2^{-8}$ | $2^{-9}$ |
|-----|---|---|---|---|---|---|---|---|---|
| h0  |   |   |   |   |   |   |   |   | 1 |
| h1  |   |   |   |   |   |   |   | n | n |
| h2  |   |   |   | n |   |   | 1 |   |   |
| h3  |   | n |   | 1 |   |   |   |   |   |
| h4  |   | 1 |   |   |   |   |   |   |   |
| h5  | 1 |   |   |   |   |   |   |   |   |
| h6  |   | 1 |   |   |   |   |   |   |   |
| h7  |   | n |   | 1 |   |   |   |   |   |
| h8  |   |   |   | n |   |   | 1 |   |   |
| h9  |   |   |   |   |   |   |   | n | n |
| h10 |   |   |   |   |   |   |   |   | 1 |

In Table 3, each box in double lines denotes a group of vertical common subexpressions, each blank denotes a numeral "0", each column indicates a 1-bit CSD type filter coefficient, and each row indicates a tap of a filter. For example, a tap "h0" has a CSD filter coefficient "000000001". A term "$2^{-1}$" indicates −1 multiplication of 2 (i.e., $2^{-1}$) and a term "$2^{-2}$" indicates −2 multiplication of 2 (i.e., $2^{-2}$). A cross point of a first row (h0) and a first column ($2^{-1}$) is defined as a reference point "$x_1$". If a signal is moved to a horizontal direction from the reference point "$x_1$", the signal is shifted to a lowest level bit direction (LSB). If moved to a vertical direction, the signal is delayed by a unit time.

Referring to Table 3, a vertical common subexpression "1n" may be obtained form CSD code words of adjacent filter coefficients. For example, the vertical common subexpression "1n" of a tap (h0) filter coefficient and a tap (h1) filter coefficient is obtained from the ninth bits of the CSD code words (000000001) of the tap (h0) and the CSD code words (000000n0n) of the tap (h1). The vertical common subexpression "n1" of a tap (h1) filter coefficient and a tap (h2) filter coefficient is obtained from the seventh bits of the CSD code words (000000n0n and 000n00100) of h1 and h2. If the CSD code words of the adjacent filter coefficients have a plurality of vertical common CSD code words, a vertical common CSD code word in a highest level bit (MSB) of the vertical common CSD code words is assigned as the vertical common subexpression.

Since the vertical common subexpressions, i.e., "1n" and "n1", in Table 3, have a same architecture due to their complemental relationship, these vertical common subexpressions can be expressed as one vertical common subexpression "1n". Let the vertical common subexpression "1n" be "$x_2$".

The vertical common subexpression "$x_2$" may be defined by the sum of "1" and "n" in a vertical direction as follows.

$x_2 = x_1 - x_1[-1]$: common subexpression

That is, the vertical common subexpression "$x_2$" is the sum (in this case, negative sum) of a coefficient (i.e., 1) of the reference point "$x_1$" and a coefficient (i.e., n) of the vertically delayed (1 tap delayed) and inverted (minus sign or plus sign) reference point "$x_1$". Therefore, if a digit "1" locates at a cross point of a row 1 (h0) and a column 1 ($2^{-1}$) and a digit "n" locates at a cross point of a row 2 (h1) and a column 1, the vertical common subexpression "$x_2$" is defined as a group of these digits in a vertical direction. A filter requires one adder (in this case, subtracter) to implement the vertical common subexpression "$x_2$", and an output signal (y) of the filter may be expressed as follow.

$$y = x_2 >> 8 - x_2[-1] >> 6 - x_2[-2] >> 3 - x_2[-3] >> 1 + x_1[-4] + x_2[-5] >> 1 + x_2[-6] >> 3 + x_2[-7] >> 6 - x_2[-8] >> 8$$

wherein the symbol ">>" indicates shifting of an input signal (x) and the symbol "[ ]" indicates delaying of the input signal (x).

For example, since the expression "$x_2 >> 8$" means that the vertical common subexpression "$x_2$" is shifted to a right direction by 8 bits, the symbol "$x_2 >> 8$" indicates "1 and n" located at cross points of rows 1 (h0) and 2 (h1) and a column 9 ($2^{-9}$). The symbol "$-x_2[-1] >> 6$" means that the vertical common subexpression "$x_2$" is delayed to a vertical direction by 1 (1 tap) and shifted to a right direction by 6 bits. Thus, the symbol indicates that "n and 1" are located at cross points of rows 2 (h1) and 3 (h2) and column 7 ($2^{-7}$). The symbol "$-x_2[-2] >> 3$" means that the vertical common subexpression "$x_2$" is inverted with its sign, delayed by 2 (2 taps) and shifted to a right direction by 3 bits. The symbol "$-x_2[-2] >> 3$" indicates that "n and 1" are located at cross points of rows 3 (h2) and 4 (h3) and column 4 ($2^{-3}$). Here, because the $x_1$ itself includes a 1-bit shifting, a common subexpression is shifted by 1-bit less than the number of columns having the common subexpressions. For example, the common subexpression in column 4 is shifted by 3 bits.

That is, the output signal of the filter is implemented by synthesizing converted values, i.e., shifted and delayed values of CSD code words of filter coefficients having the vertical common subexpression "$x_2$" with reference to the vertical common subexpression "$x_2$".

Figure 2:
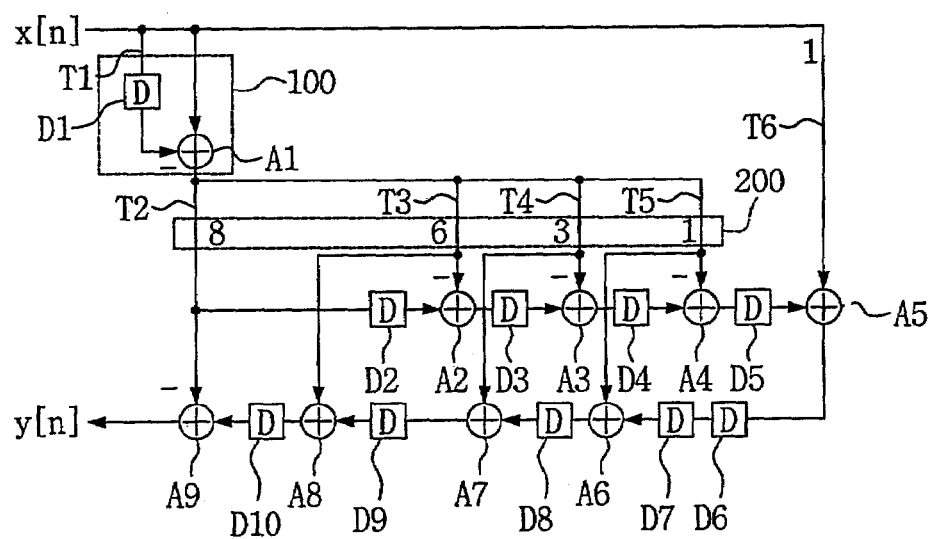
FIG. 2 is a circuit diagram of a CSD linear phase filter implemented using a vertical common subexpression method according to an embodiment of the present invention.

A filter requires total 9 adders comprising 8 adders for implementing the output signal (y) according to the above formula, like the filter as shown in FIG. 2, and one adder for implementing the vertical common subexpression "$x_2$".

FIG. 2 shows a linear phase digital filter architecture using a vertical common subexpression method according to an embodiment of the present invention. The linear phase digital filter has CSD filter coefficients expressed with CSD code words having a given number of bits as filter coefficients at taps of delay lines.

Referring to FIG. 2, the linear phase digital filter comprises a vertical common subexpression generator 100 comprising an adder A1 and a delayer D1 connected to a data input terminal x [n] and for assigning a vertical common subexpression to a highest level bit of the CSD code words when there are a plurality of vertical common subexpressions in the CSD code words of the adjacent filter coefficients, a shift register 200 comprising a plurality of shifters commonly connected to an output terminal of the adder A1 and for shifting the output of the adder A1 by a predetermined number of bits, the shifters being arranged in a highest level shifted bit, i.e., in the order of 8-bit shifter, 6-bit shifter, 3-bit shifter and 1-bit shifter, a plurality of adders A2, A3, A4, A6, A7, A8, A9, each input terminal being connected to each output terminal of the shifters of the shift register 200, and a plurality of delays D3, D4, D8, D9, D10 alternatively connected to the adders and for delaying the outputs of the adders by a unit time (one clock cycle).

The adders connected to tap lines T1 through T6 are designated as Ai (i is a natural number greater than 1), delayers as Di, an input signal as x, and an output signal as y, respectively. The numeral next to the tap lines T2–T5 indicates the number of shifted bits. For example, the numeral "8" next to the tap line T2 means that the input signal (x) to be filtered is shifted by 8 bits to a LSB direction. Shift registers may be used for a multiplication in which the input signal (x) is shifted in response to a clock signal. Although a subtracter is not illustrated in FIG. 2, the adders with the symbol "−" at input terminals thereof indicate substracters.

The vertical common subexpression "$x_2$" (i.e., "1n") is implemented at line T2 in FIG. 2. That is, the vertical common subexpression "1n" in Table 3 is implemented with the adder A1 (in this case, subtraction) that adds the coefficient (in this case, 1) of the reference point "$x_1$" and the coefficient (in this case, n) of delayed (1 tap delayed with the delayer D1) and inverted reference point "$x_1$". Accordingly, the delayer D1 and the adder A1 construct the vertical common subexpression generator 100.

The vertical common subexpression "$x_2$" output from vertical common subexpression generator 100 is shifted by 8 bits through the 8-bit shifter of the shift register 200 and the tap line T2, so that the coefficients $h_0$, $h_1$ and $h_9$, $h_{10}$ in Table 3 are implemented. The tap line T2 is for implementing "$x_2$>>8" and "−$x_2$[−8]>>8", and the adder A9 is for calculating "−$x_2$[−8]>>8".

The tap line T3 outputs the 6-bit shifted vertical common subexpression $x_2$ through the 6-bit shifter of the shift register 200 to implement the coefficients $h_1$, $h_2$ and $h_8$, $h_9$ in Table 3. The line T3 is for implementing "−$x_2$[−1]>>6" and "$x_2$[−7]>>6", the adder A2 calculates "−$x_2$[−1]>>6" and the adder A8 calculates "$x_2$[−7]>>6".

The line T4 outputs the 3-bits shifted vertical common subexpression $x_2$ through the 3-bit shifter of the shift register 200 to implement the coefficients $h_2$, $h_3$ and $h_7$, $h_8$ in Table 3. The line T4 is for implementing "−$x_2$[−2]>>3" and "$x_2$[−6]>>3", the adder A3 calculates "−$x_2$[−2]>>3" and the adder A7 calculates "$x_2$[−6]>>3".

The coefficients $h_3$, $h_4$ and $h_6$, $h_7$ in Table 3 are implemented through the tap line T5. The line T5 is for implementing "−$x_2$[−3]>>1" and "$x_2$[−5]>>1", the adder A4 calculates "−$x_2$[−3]>>1" and the adder A6 calculates "$x_2$[−5]>>1".

The coefficient $h_5$ is implemented through the tap line T6 for implementing "$x_1$[−4]", instead of using the vertical common subexpression. The adder A5 computes the $x_1$[−4]. Since $x_1$ is a reference point having 1-bit shift to a lowest level bit direction and requires one more shift to be implemented, a shift bit "1" is required in implementing the coefficient $h_5$.

The delayers Di delay the outputs of the corresponding adders by a unit time to obtain the output signal (y). The delay timing comprises one clock cycle.

The digital filter according to the present invention comprises the plurality of adders A9, A2, A3, A4, A6, A7, A8 commonly connected to the tap line T2 outputting the vertical common subexpression "$x_2$" through the corresponding 8, 6, 3, 1-shifters of the shift register (200).

Advantageously, since the filter architecture of FIG. 2 using the vertical common subexpression method requires the number of adders less than the number of adders in a conventional filter architecture (as shown in FIG. 1) by 4 adders, a reduction ratio of 30.8% in the number of adders is achieved.

Figure 7:
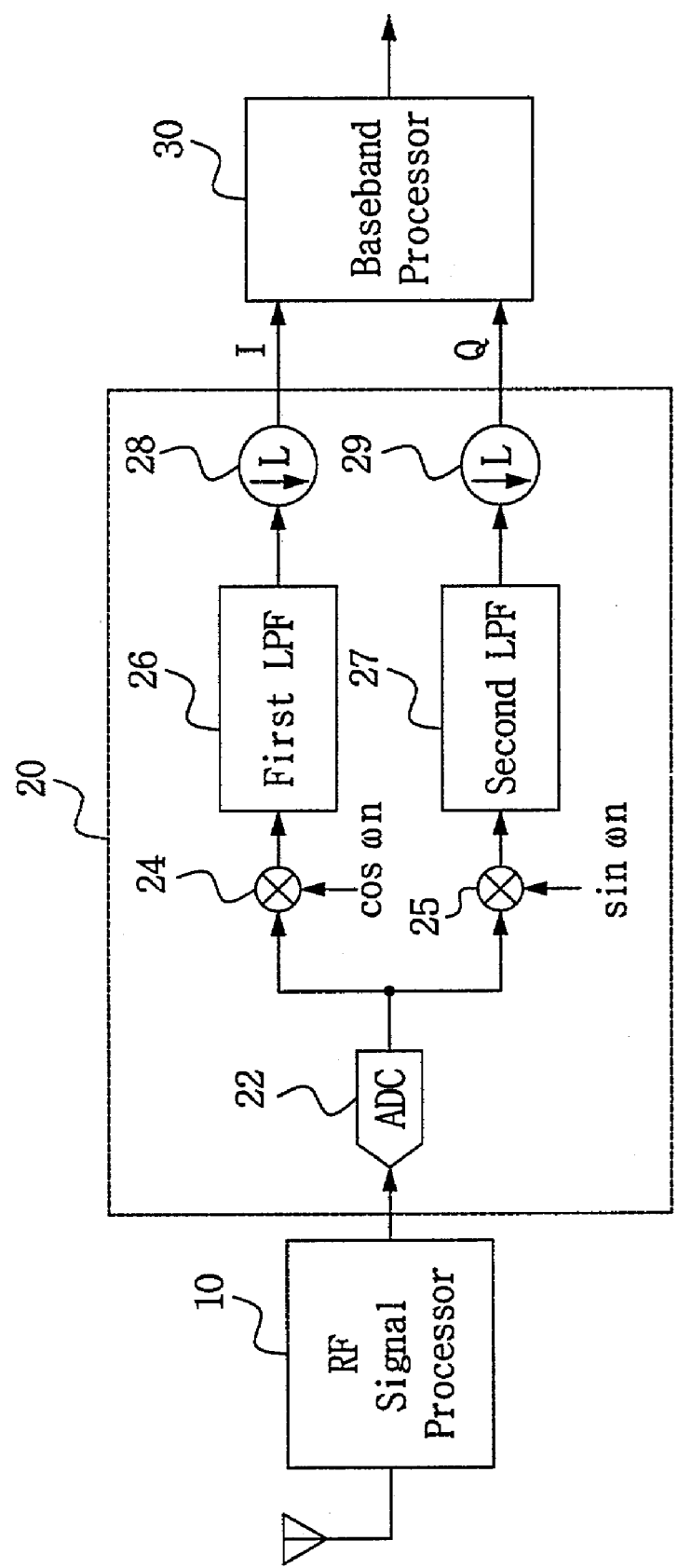
FIG. 7 is a block diagram of a wireless receiver terminal employing a digital filter according to an embodiment of the present invention.

FIG. 7 shows an IF digital signal processor of a wireless receiving terminal employing a digital filter according to the present invention. Referring to FIG. 7, an analog input signal is received through a RF signal processor 10 and is input to an intermediate frequency processor 20 comprising a A/D converter 22, multipliers 24, 25, first and second low pass filters (LPFs) 26, 27, and first and second decimators 28, 29.

The analog signal is converted into digital samples having a predetermined bit by the A/D converter 22 to output to the first and second multipliers 24, 25. The multipliers 24, 25 respectively multiply the digital samples by cos ωn and sin ωn to mix them, and provide the mixed signal to the first and second low pass filters (LPFs) 26, 27. The first and second low pass filters 26, 27 filter the mixed signal in a given band and output the filtered signal to the corresponding decimators 28, 29. The decimators 28, 29 decimate the filtered intermediate frequency signal to generate signals I, Q and provide the signals I, Q to the base band processor 30. The base band processor 30 performs channel coding and source coding of the signals I, Q.

For example, the intermediate frequency processor 20 can be implemented with a Digital Frequency Down Converter (DFDC) as shown in FIG. 8 in which an integrated circuit "HSP50214" of Harris Semiconductor is illustrated. The circuit of FIG. 8 comprises a CIC filter 2, a CSD filter 3 and a parallel filter 4 all connected to a mixer 1. The CSD filter 3, comprising a half band filter and a programmable filter, may be implemented with the vertical common subexpression method according to the present invention, because the filter 3 necessarily requires a high-speed and low power operation.

For example, the specification of a CDMA IS-95 intermediate frequency terminal (that is suggested by Qualcomm in 1995) was implemented with the vertical common subexpression method of the present invention. Here, a sampling frequency of a digital filter was 19.6608 MHz, a pass band frequency and an amount of damping were 630 KHz and 0.1 dB, respectively, and a stop band frequency and an amount of damping were 1.2288 MHz and −40 dB, respectively. A linear phase filter was designed using a COSSAP FIR filter design tool according to the specification, so that a linear phase filter coefficient of 73 taps was achieved.

Table 4 shows CSD type coefficients of 24-bit precision for 37 coefficients except 36 symmetric coefficients out of the above 73 filter coefficients. In Table 4, "−1" is indicated as "n", columns indicate coefficients of $h_0$ through $h_{36}$ and rows indicates bits of $2^{-1}$ through $2^{-24}$.

TABLE 4

73 taps FIR filter

| | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|
| 0 | | | | | | | | | | n | | n | | | n | 1 | | 1 | | | | n | | |
| 1 | | | | | | | | | | | n | | 1 | | 1 | | | | | | | n | | |
| 2 | | | | | | | | | | n | | 1 | | n | | | 1 | | | | 1 | | n | |
| 3 | | | | | | | | | n | | n | | | | n | | 1 | | | | | | 1 | |
| 4 | | | | | | | | | | n | | n | | 1 | | n | | | n | | | | | |
| 5 | | | | | | | | | 1 | | n | | n | | | | | 1 | | 1 | | n | | |
| 6 | | | | | | | 1 | | n | | | | 1 | | | n | | n | | 1 | | | | |
| 7 | | | | | | | | 1 | | n | | | n | | n | | | | n | | n | | | |
| 8 | | | | | | | | 1 | | | | | 1 | | 1 | | | 1 | | | n | | n | |
| 9 | | | | | | | | 1 | | 1 | | 1 | | 1 | | | | 1 | | n | | | n | |
| 10 | | | | | | | 1 | | n | | | | 1 | | | | 1 | | 1 | | 1 | | n | |
| 11 | | | | | | | 1 | | n | | 1 | | | | n | | 1 | | n | | n | | n | |
| 12 | | | | | | | 1 | | n | | | | 1 | | | | | n | | | n | | n | |
| 13 | | | | | | | | 1 | | 1 | | | | | 1 | | | 1 | | 1 | | | | 1 |
| 14 | | | | | | | | 1 | | n | | 1 | | n | | n | | 1 | | 1 | | 1 | | |
| 15 | | | | | | | | | | 1 | | 1 | | n | | | n | | | | n | | 1 | |
| 16 | | | | | | | n | | n | | n | | 1 | | | | 1 | | n | | 1 | | | |
| 17 | | | | | | | n | | 1 | | | | n | | | | n | | 1 | | 1 | | | |
| 18 | | | | | | | n | | n | | | 1 | | | 1 | | | | n | | 1 | | n | |
| 19 | | | | | | n | | 1 | | n | | | | | 1 | | n | | | | | | | |
| 20 | | | | | | n | | | | 1 | | | | n | | 1 | | | 1 | | | | | |
| 21 | | | | | | n | | | n | | 1 | | n | | | | n | | 1 | | 1 | | | |
| 22 | | | | | | n | | | n | | 1 | | | | | n | | 1 | | 1 | | 1 | | |
| 23 | | | | | | n | | 1 | | 1 | | | | | | | | 1 | | 1 | | | | |
| 24 | | | | | | n | | 1 | | 1 | | 1 | | 1 | | 1 | | | n | | | | n | |
| 25 | | | | | | | n | | n | | | 1 | | n | | | | | n | | | | | |
| 26 | | | | | | 1 | | | | n | | n | | | n | | | | | | | | | |
| 27 | | | | | 1 | | | n | | | | | n | | | | | n | | n | | | n | |
| 28 | | | | 1 | | n | | 1 | | n | | 1 | | n | | | | | 1 | | n | | | |
| 29 | | | | 1 | | 1 | | n | | | | 1 | | | 1 | | n | | n | | | | | |
| 30 | | | 1 | | n | | 1 | | n | | | | | | 1 | | n | | 1 | | n | | | |
| 31 | | | 1 | | | | | | | n | | | | | 1 | | n | | 1 | | 1 | | | |
| 32 | | | 1 | | 1 | | n | | n | | | | n | | 1 | | n | | n | | 1 | | | |
| 33 | | | 1 | | 1 | | 1 | | 1 | | 1 | | 1 | | n | | 1 | | | | 1 | | | |
| 34 | | 1 | | n | | n | | | | | | 1 | | 1 | | | n | | 1 | | | | | |
| 35 | | 1 | | n | | | | 1 | | 1 | | 1 | | | | | | | 1 | | | | | |
| 36 | | 1 | | n | | | 1 | | | 1 | | | | | n | | n | | n | | n | | | |

Table 5 shows conventional horizontal common subexpressions generated with 1 bit to 9 bits out of the CSD coefficients in Table 4, Table 6 shows vertical common subexpressions generated with 1 bit to 9 bits out of the CSD coefficients in Table 4.

TABLE 5

Conventional common subexpressions (9 bits)

| | 1 | 2 | 3 | 4 | 5 | 6 | 7 | 8 | 9 | # |
|---|---|---|---|---|---|---|---|---|---|---|
| 0 | | | | | | | | n | | 1 |
| 1 | | | | | | | | | | |
| 2 | | | | | | | | | | |
| 3 | | | | | | | | | | |
| 4 | | | | | | | | | | |
| 5 | | | | | | | | | | |
| 6 | | | | | | | | | | |
| 7 | | | | | | | 1 | | | 2 |
| 8 | | | | | | | 1 | | | 2 |
| 9 | | | | | | | 1 | | | 2 |
| 10 | | | | | | 1 | | | | 2 |
| 11 | | | | | | 1 | | | | 2 |
| 12 | | | | | | 1 | | | | 2 |
| 13 | | | | | | | 1 | | | 2 |
| 14 | | | | | | | 1 | | | 2 |
| 15 | | | | | | | | | | |
| 16 | | | | | | | | | | |

TABLE 5-continued

Conventional common subexpressions (9 bits)

| | 1 | 2 | 3 | 4 | 5 | 6 | 7 | 8 | 9 | # |
|---|---|---|---|---|---|---|---|---|---|---|
| 17 | | | | | | | | n | | 2 |
| 18 | | | | | | | | n | | 2 |
| 19 | | | | | | | n | | 1 | 2 |
| 20 | | | | | | | n | | | 2 |
| 21 | | | | | | | n | | | 2 |
| 22 | | | | | | | n | | | 2 |
| 23 | | | | | | | n | | | 2 |
| 24 | | | | | | | n | | 1 | 2 |
| 25 | | | | | | | | n | | 2 |
| 26 | | | | | | | | 1 | | 2 |
| 27 | | | | | | | 1 | | | 2 |
| 28 | | | | | | 1 | | n | | 2 |
| 29 | | | | | | 1 | | 1 | | 2 |
| 30 | | | | | 1 | | n | | 1 | 3 |
| 31 | | | | | 1 | | | | | 2 |
| 32 | | | | | 1 | | 1 | | n | 3 |
| 33 | | | | | 1 | | 1 | | 1 | 3 |
| 34 | | | | 1 | | n | | | n | 3 |
| 35 | | | | 1 | | n | | | | 2 |
| 36 | | | | 1 | | n | | | | 1 |

TABLE 6

Vertical common subexpressions (9 bits)

| | 1 | 2 | 3 | 4 | 5 | 6 | 7 | 8 | 9 | # |
|---|---|---|---|---|---|---|---|---|---|---|
| 0 | | | | | | | | | n | 1 |
| 1 | | | | | | | | | | |
| 2 | | | | | | | | | | |
| 3 | | | | | | | | | | |
| 4 | | | | | | | | | | |
| 5 | | | | | | | | | | |
| 6 | | | | | | | | | | |
| 7 | | | | | | | | 1 | | |
| 8 | | | | | | | | 1 | | |
| 9 | | | | | | | | 1 | | 2 |
| 10 | | | | | | | 1 | | | |
| 11 | | | | | | | 1 | | | |
| 12 | | | | | | | 1 | | | 2 |
| 13 | | | | | | | 1 | | | |
| 14 | | | | | | | 1 | | | 2 |
| 15 | | | | | | | | | | |
| 16 | | | | | | | | | | |
| 17 | | | | | | | n | | | |
| 18 | | | | | | | n | | | 2 |
| 19 | | | | | | n | | 1 | | 2 |
| 20 | | | | | | n | | | | |
| 21 | | | | | | n | | | | 2 |
| 22 | | | | | | n | | | | |
| 23 | | | | | | n | | | | |
| 24 | | | | | | n | | 1 | | 2 |
| 25 | | | | | | n | | | | |
| 26 | | | | | | | | 1 | | 2 |
| 27 | | | | | | | 1 | | | 2 |
| 28 | | | | | 1 | | n | | | |
| 29 | | | | | 1 | | 1 | | | 3 |
| 30 | | | | 1 | | | n | 1 | | 2 |
| 31 | | | | 1 | | | | | | 2 |
| 32 | | | | 1 | | | 1 | n | | |
| 33 | | | | 1 | | | 1 | 1 | | 3 |
| 34 | | | 1 | | | n | | n | | 2 |
| 35 | | | 1 | | | n | | | | 3 |
| 36 | | | 1 | | | n | | | | 1 |

TABLE 7

Conventional common subexpressions (10-bit)

| | 1 | 2 | 3 | 4 | 5 | 6 | 7 | 8 | 9 | 10 | # |
|---|---|---|---|---|---|---|---|---|---|---|---|
| 0 | | | | | | | | | n | | 1 |
| 1 | | | | | | | | | | n | 2 |
| 2 | | | | | | | | | | n | 2 |
| 3 | | | | | | | | | | | |
| 4 | | | | | | | | | | | |
| 5 | | | | | | | | | | | |
| 6 | | | | | | | | | | 1 | 2 |
| 7 | | | | | | | | | 1 | | 2 |
| 8 | | | | | | | | | 1 | | 2 |
| 9 | | | | | | | | | 1 | | 2 |
| 10 | | | | | | | | 1 | | n | 2 |
| 11 | | | | | | | | 1 | | n | 2 |
| 12 | | | | | | | | 1 | | n | 2 |
| 13 | | | | | | | | | 1 | | 2 |
| 14 | | | | | | | | | 1 | | 2 |
| 15 | | | | | | | | | | | |
| 16 | | | | | | | | | | n | 2 |
| 17 | | | | | | | | n | | 1 | 2 |
| 18 | | | | | | | | n | | n | 2 |
| 19 | | | | | | | n | | 1 | | 2 |
| 20 | | | | | | | n | | | | 2 |
| 21 | | | | | | | n | | | | 2 |
| 22 | | | | | | | n | | | | 2 |
| 23 | | | | | | | n | | | | 2 |
| 24 | | | | | | | n | | 1 | | 2 |
| 25 | | | | | | | | | n | | 2 |
| 26 | | | | | | | | | 1 | | 2 |
| 27 | | | | | | | 1 | | | n | 2 |
| 28 | | | | | | 1 | | n | | 1 | 3 |
| 29 | | | | | | 1 | | 1 | | n | 3 |
| 30 | | | | | 1 | | | n | | 1 | 3 |
| 31 | | | | | 1 | | | | | | 2 |
| 32 | | | | | 1 | | | 1 | | n | 3 |
| 33 | | | | | 1 | | | 1 | | 1 | 3 |
| 34 | | | | 1 | | | n | | | n | 3 |
| 35 | | | | 1 | | | n | | | | 2 |
| 36 | | | | 1 | | | n | | | 1 | 2 |

Figure 3A:
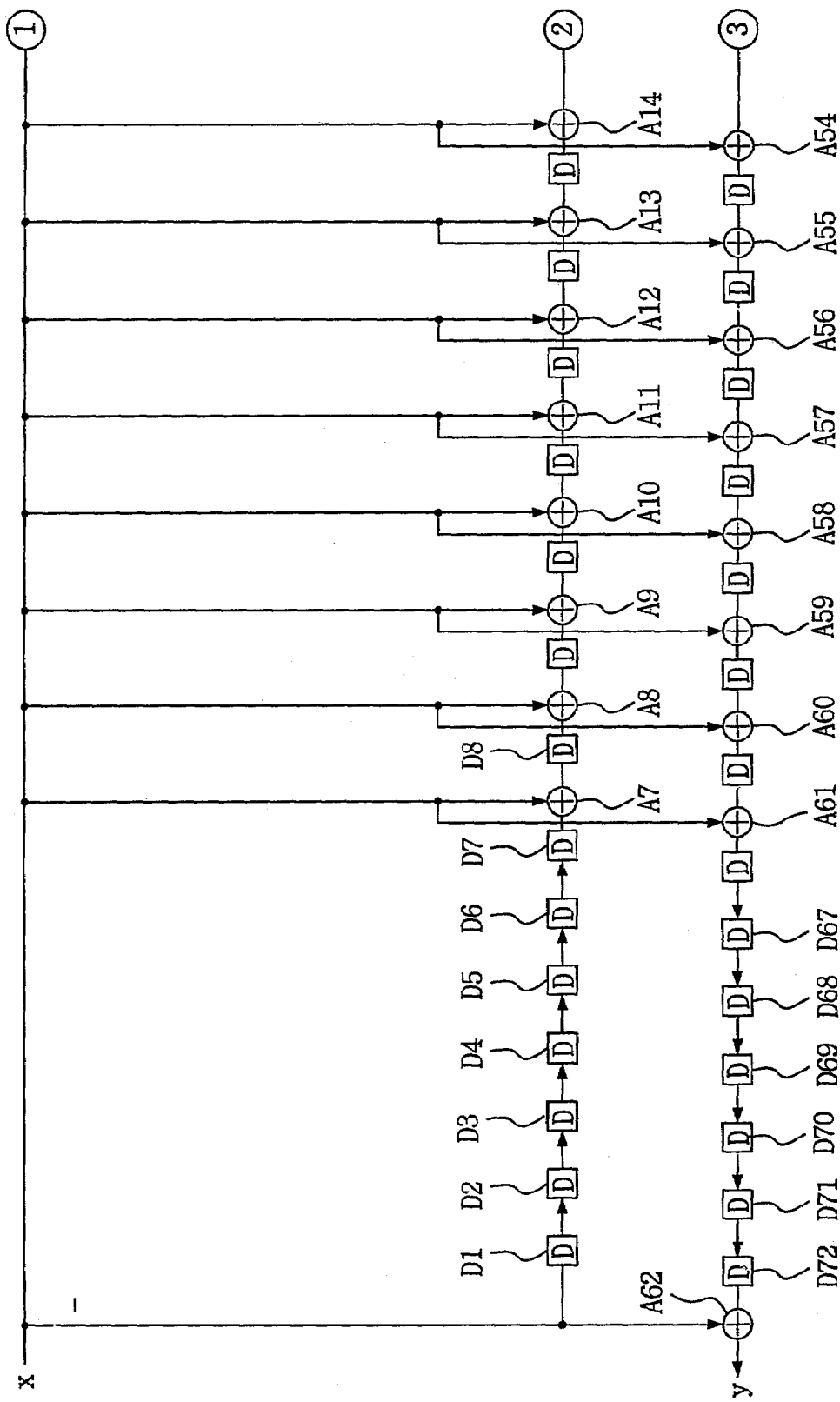
FIGS. 3A through 3C are circuit diagrams of conventional 9-bit CSD linear phase filters.
Figure 3B:
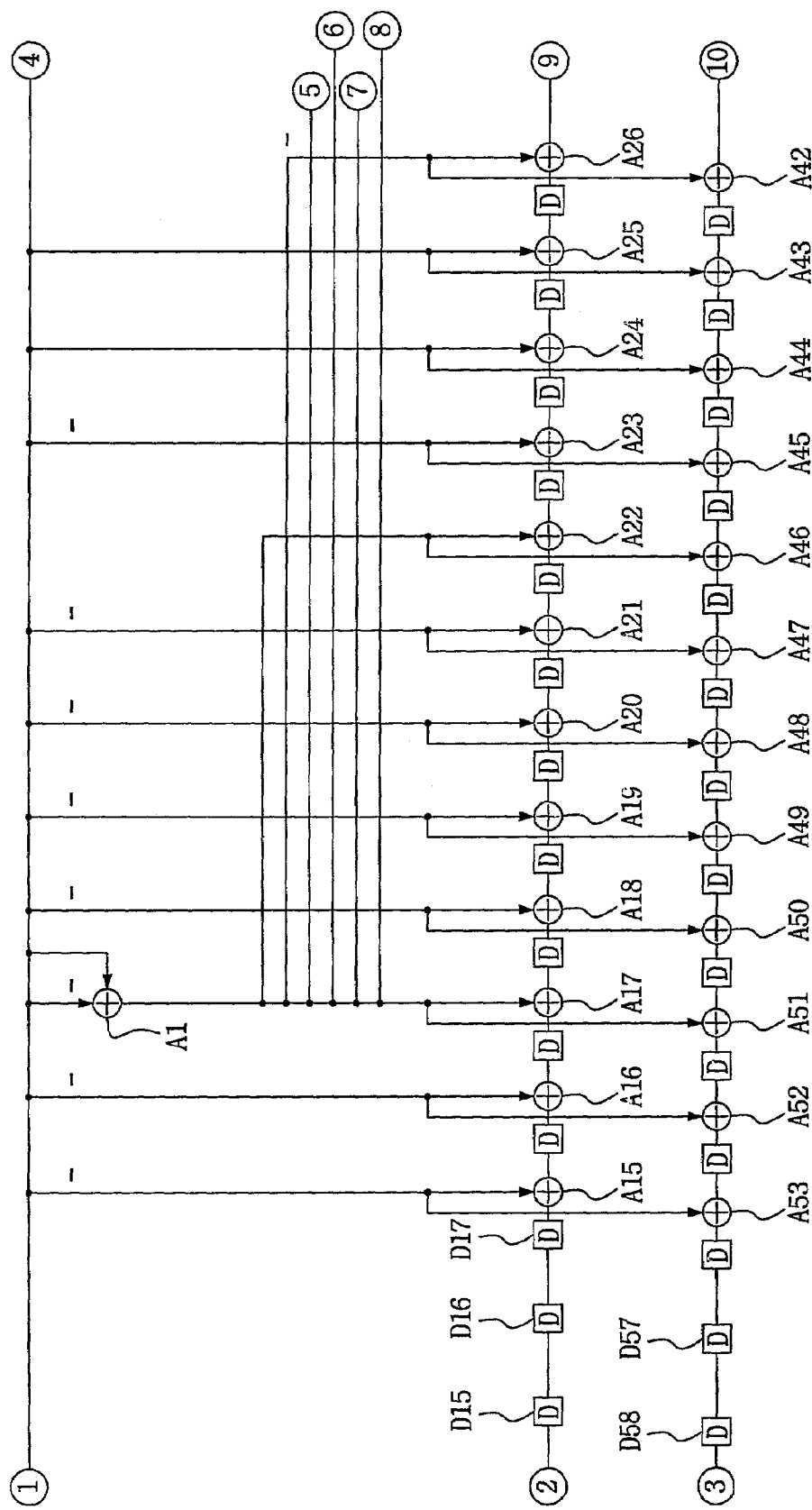
Figure 3C:
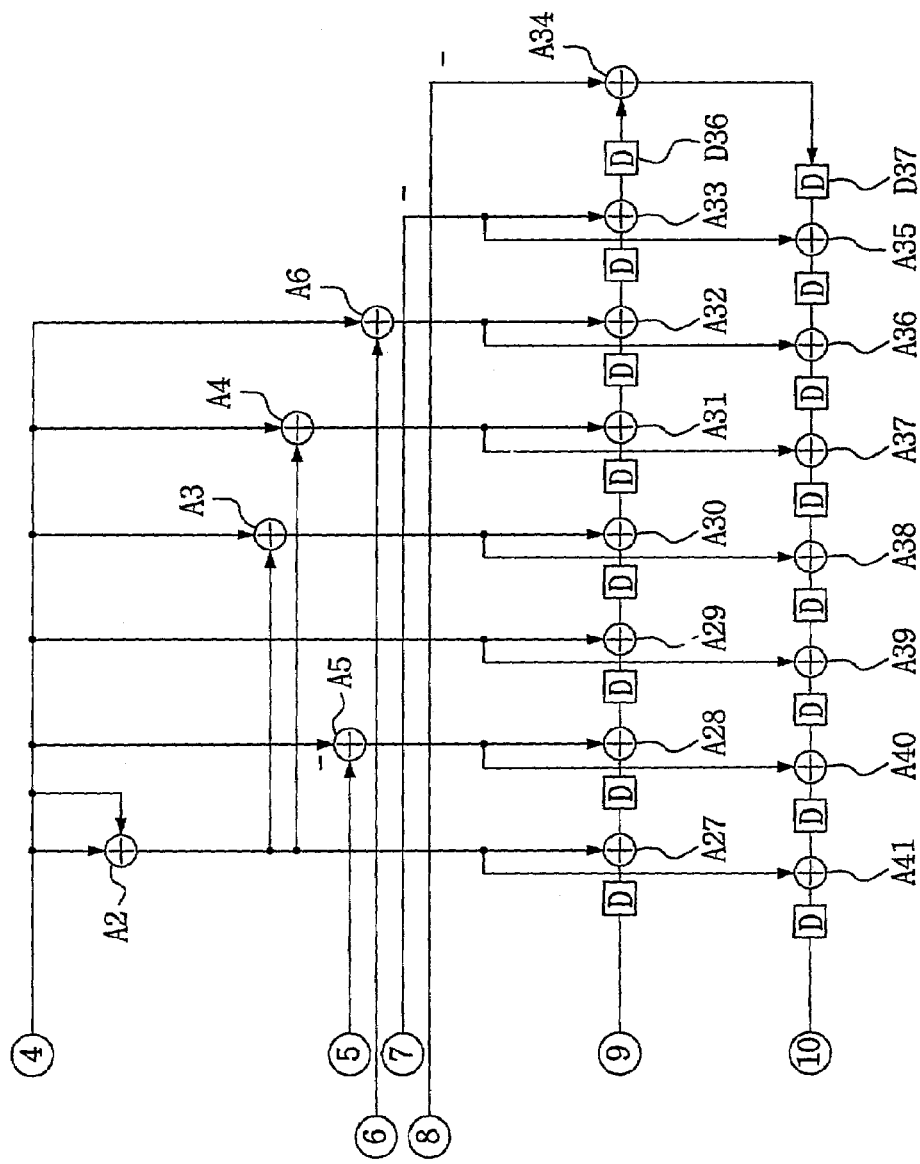

Since the conventional horizontal common subexpressions are "101" and "10n" in Table 5, 2 adders are needed to implement the common subexpressions. The last column in Table 5 indicates the number of adders necessary for implementing the coefficients of a CSD linear phase filter, and the number of adders is 60. Thus, the total 62 adders are required for implementing the common subexpressions and for implementing the coefficients. FIGS. 3A, 3B and 3C show a 9-bit CSD linear phase filters implemented according to the conventional horizontal common subexpression of Table 5.

Figure 4A:
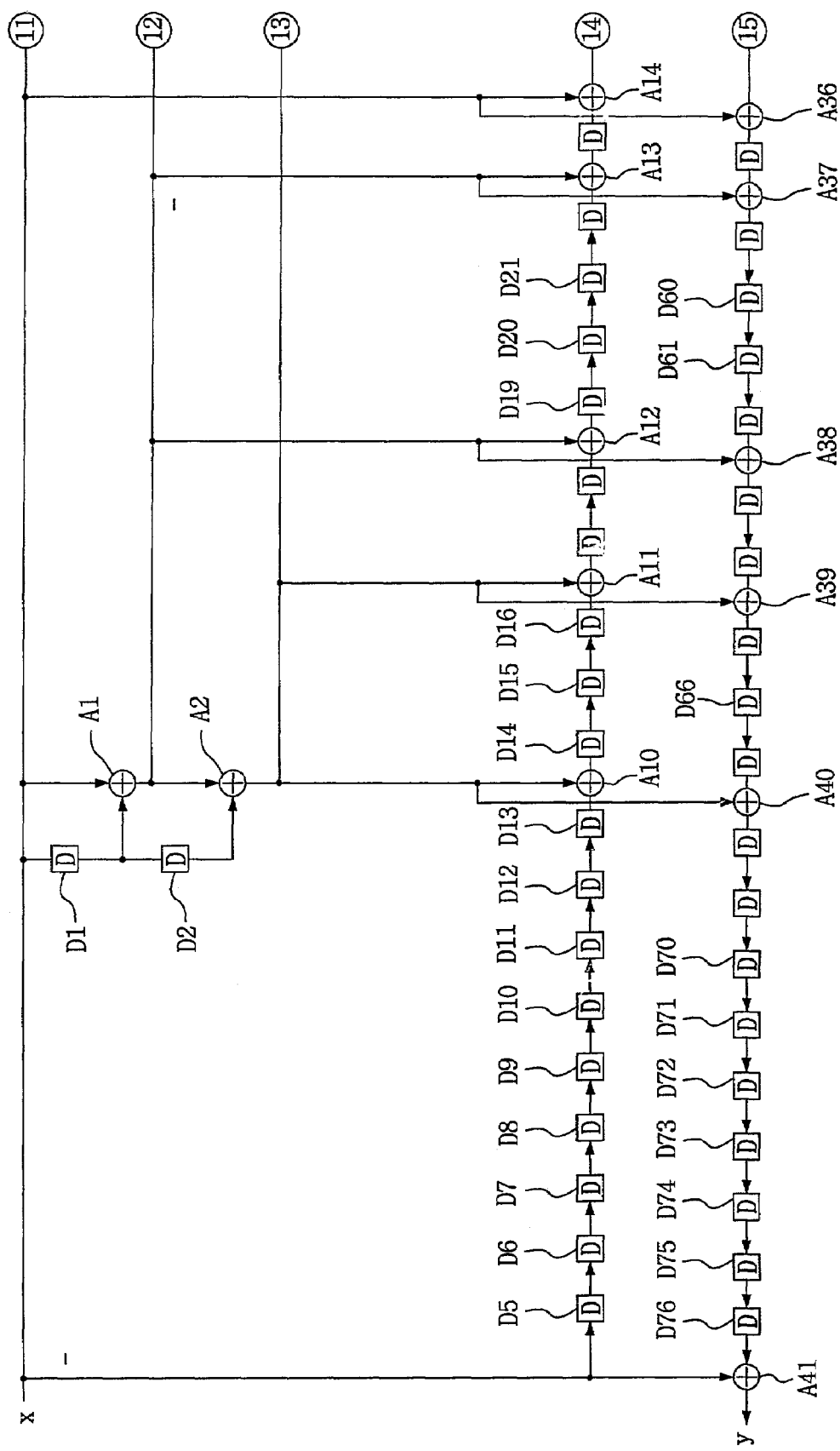
FIGS. 4A and 4B are circuit diagrams of 9-bit CSD linear phase filters according to embodiments of the present invention.
Figure 4B:
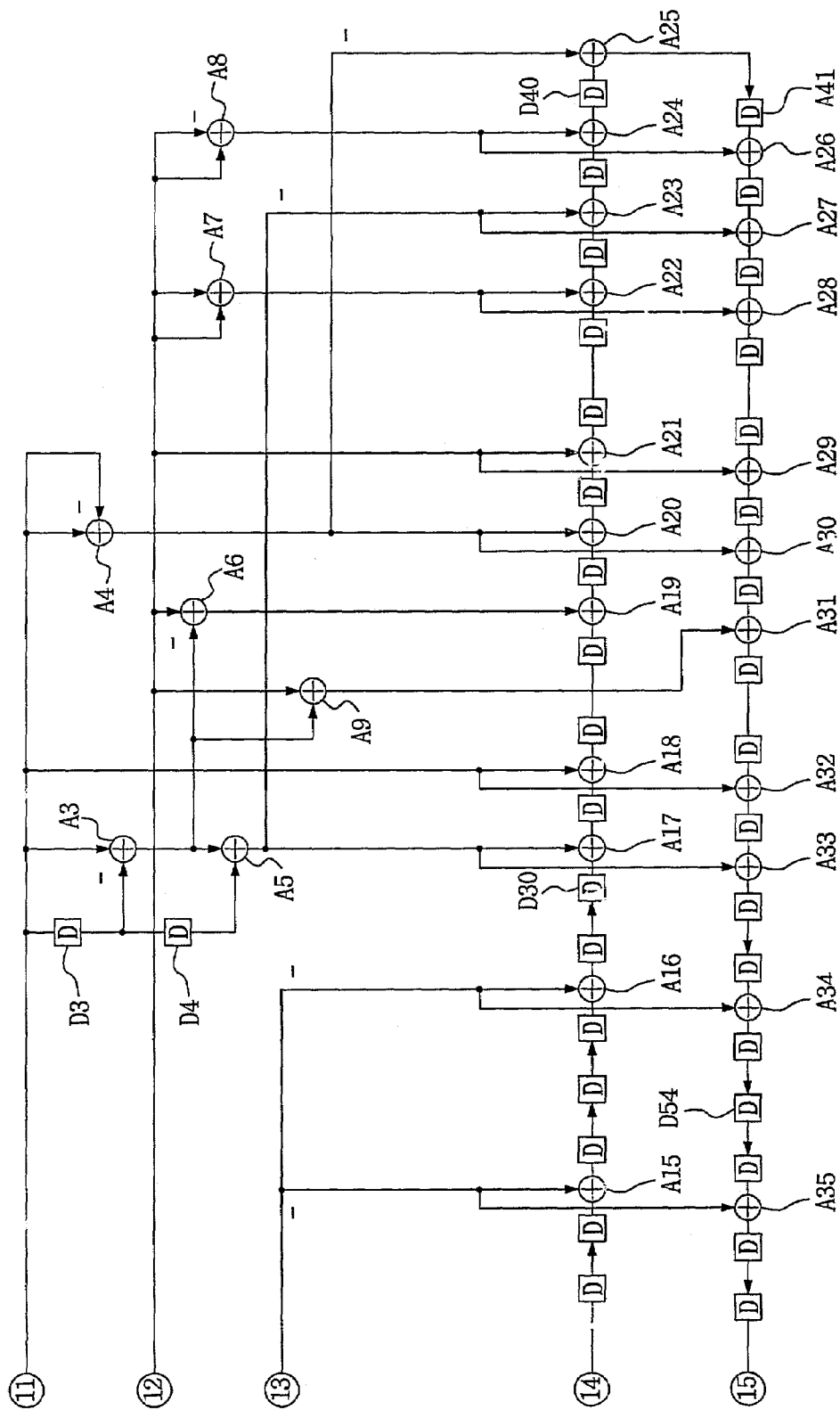

In Table 6, the vertical common subexpressions are "11", "1n", "111" and "1n1" and the horizontal common subexpressions is "10n", so that 5 adders are required to implement the common subexpressions of a CSD linear phase filter. The adders for implementing the filter are 40 adders having 35 adders (indicated in the last column in Table 6) for implementing the coefficients of the filter and 5 adders for implementing common subexpressions. FIGS. 4A and 4B show a configuration of the 9-bit CSD linear phase filter implemented according to the present invention, like the configuration as shown in FIG. 2. Compared with the configurations of FIG. 3, the configuration of FIG. 4 achieves a reduction of 64.5% in the number of adders.

Tables 7 and 8 respectively conventional horizontal common subexpressions and vertical common subexpressions of the present invention generated with 1 bit to 10 bits out of the CSD coefficients in Table 4.

TABLE 8

Vertical common subexpressions (10-bit)

| | 1 | 2 | 3 | 4 | 5 | 6 | 7 | 8 | 9 | 10 | # |
|---|---|---|---|---|---|---|---|---|---|---|---|
| 0 | | | | | | | | | n | | 1 |
| 1 | | | | | | | | | | n | |
| 2 | | | | | | | | | | n | 2 |
| 3 | | | | | | | | | | | |
| 4 | | | | | | | | | | | |
| 5 | | | | | | | | | | | |
| 6 | | | | | | | | | | 1 | 2 |
| 7 | | | | | | | | 1 | | | |
| 8 | | | | | | | | 1 | | | |
| 9 | | | | | | | | 1 | | | 2 |
| 10 | | | | | | | | 1 | | n | |
| 11 | | | | | | | | 1 | | n | |
| 12 | | | | | | | | 1 | | n | 3 |
| 13 | | | | | | | | | 1 | | |
| 14 | | | | | | | | | 1 | | 2 |
| 15 | | | | | | | | | | | |
| 16 | | | | | | | | | | n | |
| 17 | | | | | | | | n | | 1 | |
| 18 | | | | | | | | n | | n | 3 |
| 19 | | | | | | | n | | 1 | | 2 |
| 20 | | | | | | | n | | | | |
| 21 | | | | | | | n | | | | 2 |
| 22 | | | | | | | n | | | | |
| 23 | | | | | | | n | | | | |
| 24 | | | | | | | n | | 1 | | 2 |
| 25 | | | | | | | | | n | | |

TABLE 8-continued

Vertical common subexpressions (10-bit)

| | 1 | 2 | 3 | 4 | 5 | 6 | 7 | 8 | 9 | 10 | # |
|---|---|---|---|---|---|---|---|---|---|---|---|
| 26 | | | | | | | | | 1 | | 2 |
| 27 | | | | | | | 1 | | | n | 2 |
| 28 | | | | | 1 | | n | | 1 | | 1 |
| 29 | | | | | 1 | | | 1 | | n | 5 |
| 30 | | | | 1 | | n | | 1 | | | 2 |
| 31 | | | | 1 | | | | | | | 2 |
| 32 | | | | 1 | | 1 | n | | | | |
| 33 | | | | 1 | | 1 | | 1 | | | 3 |
| 34 | | | 1 | | n | | | n | | | 2 |
| 35 | | | 1 | | n | | | | | | 3 |
| 36 | | | 1 | | n | | | | | 1 | 2 |

Like in Table 5, a reduction in the number of adders can be achieved in Table 8. However, in a row corresponding to $h_{29}$ in Table 8, the number of adders is 5 although the number of objects to be added is 3 because the asymmetric vertical common subexpression "1n" is with a symmetric vertical common subexpression "11". The asymmetric vertical common subexpressions such as "1n", "10n", "11nn" should be added in reciprocal number thereof to lower terminals of a delay chain. However, when the asymmetric vertical common subexpression is with a symmetric common subexpression, like $h_{29}$, the asymmetric vertical common subexpression cannot be added in reciprocal number thereof to the terminals. The subexpressions should be separately added to the lower terminals, so that an additional adder is needed.

Figure 5A:
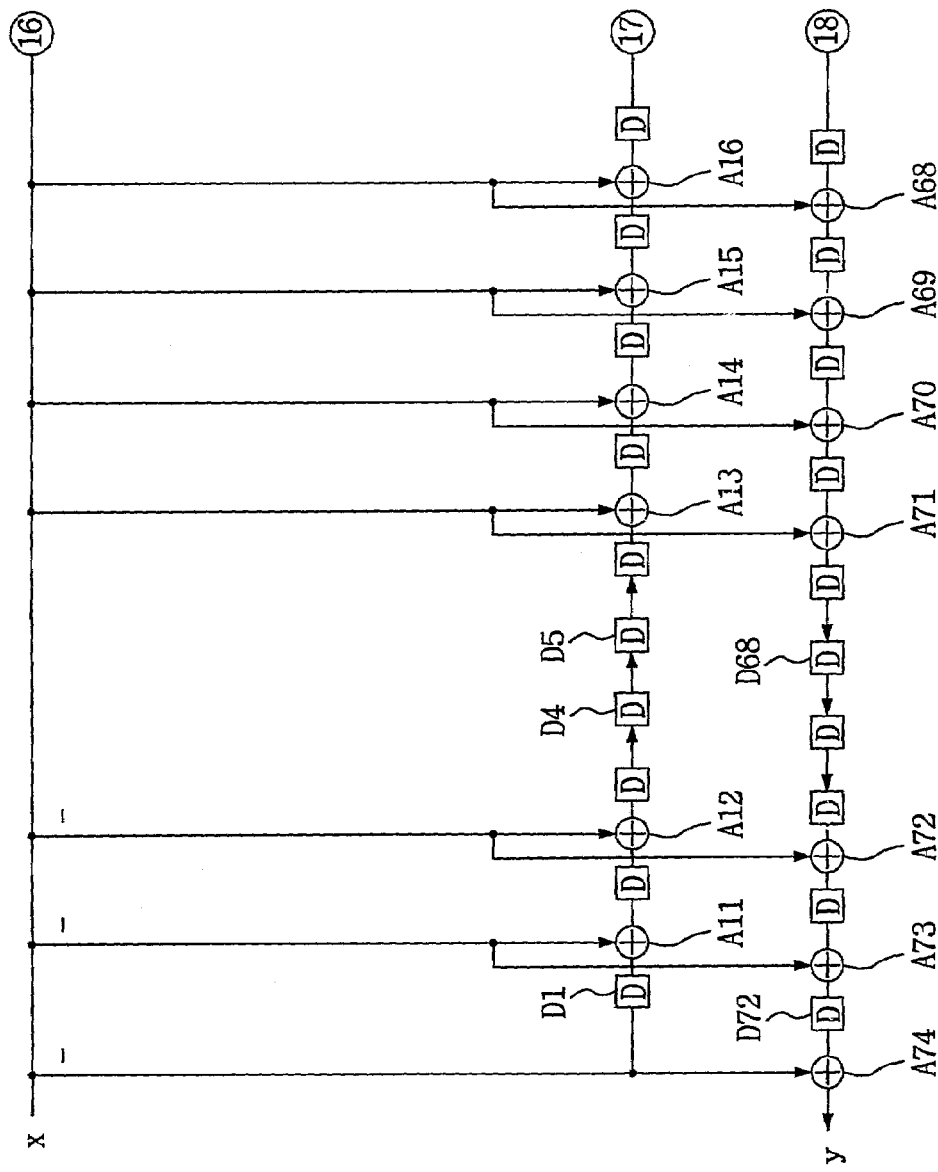
FIGS. 5A through 5C are circuits diagrams of conventional 10-bit CSD linear phase filters.
Figure 5B:
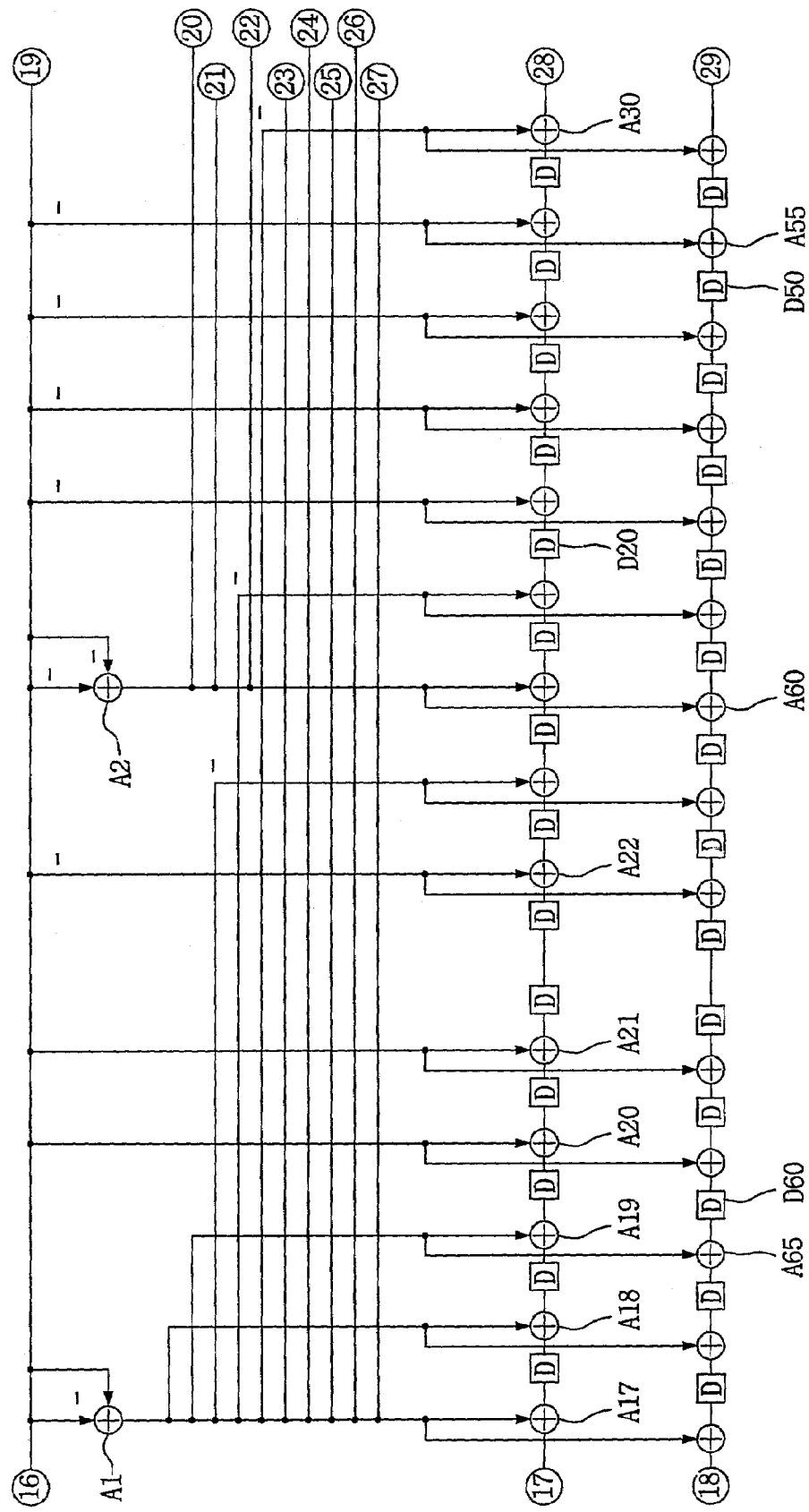
Figure 5C:
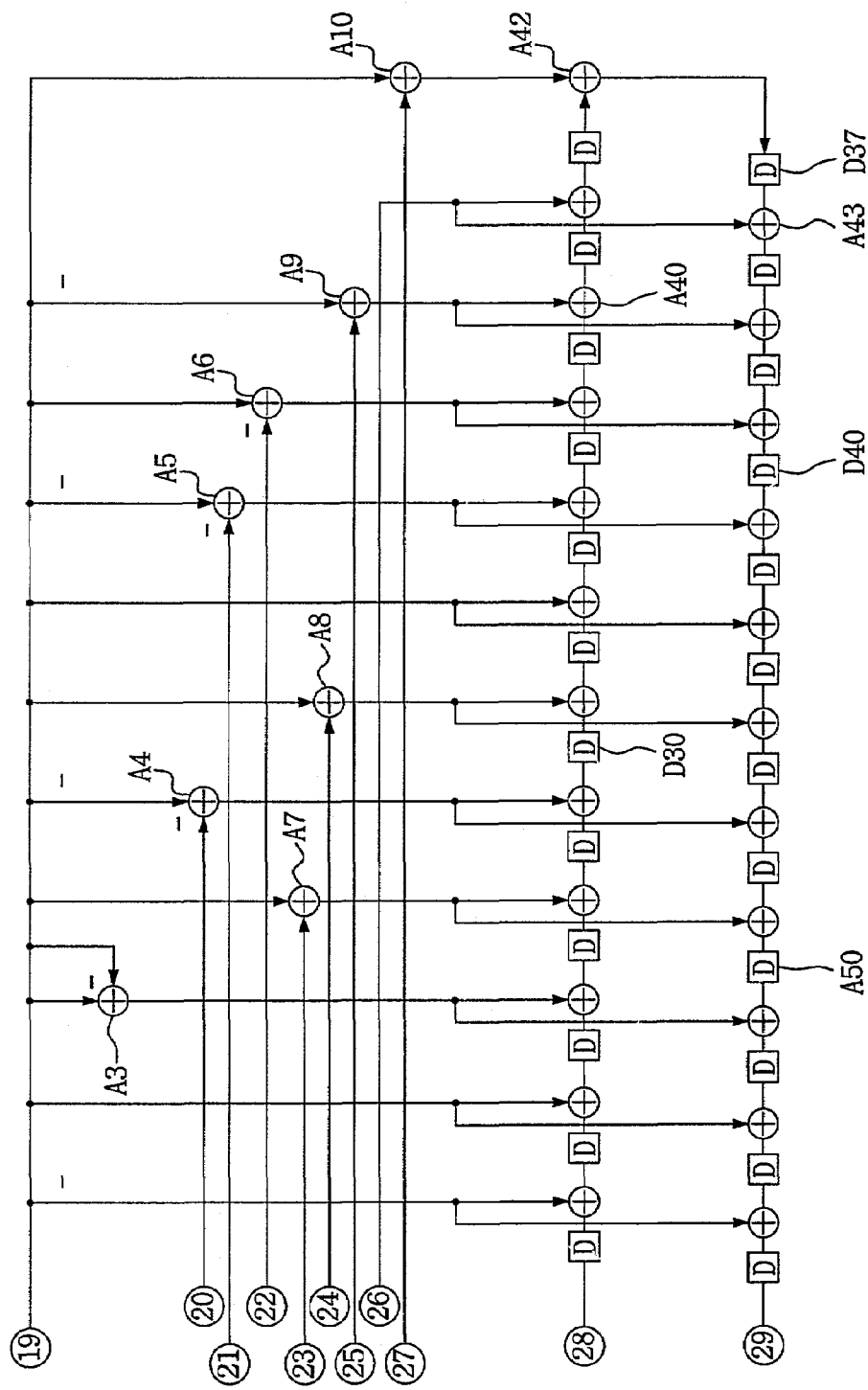
Figure 6A:
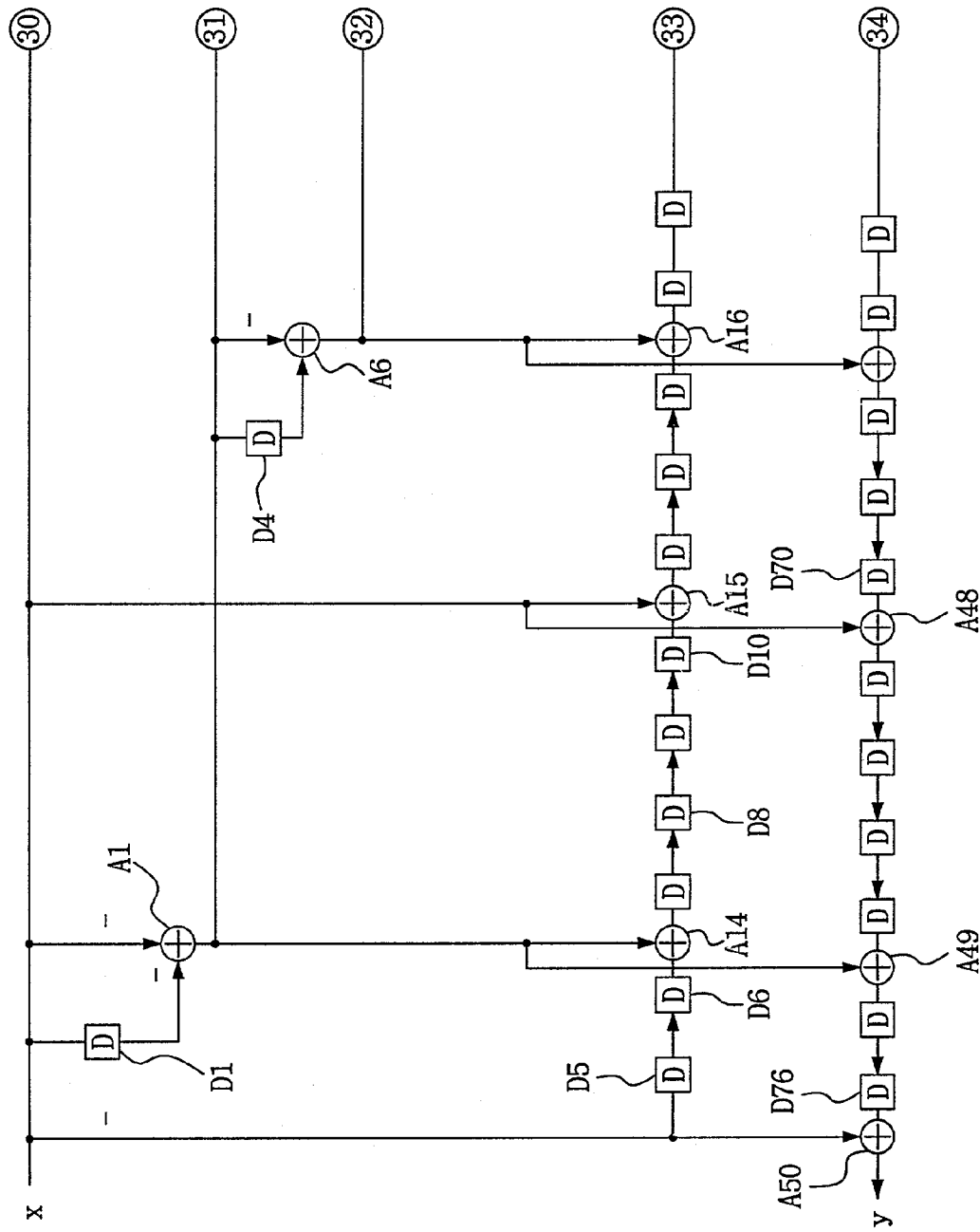
FIGS. 6A through 6C are circuit diagrams of 10-bit CSD linear phase filters according to embodiments of the present invention.
Figure 6B:
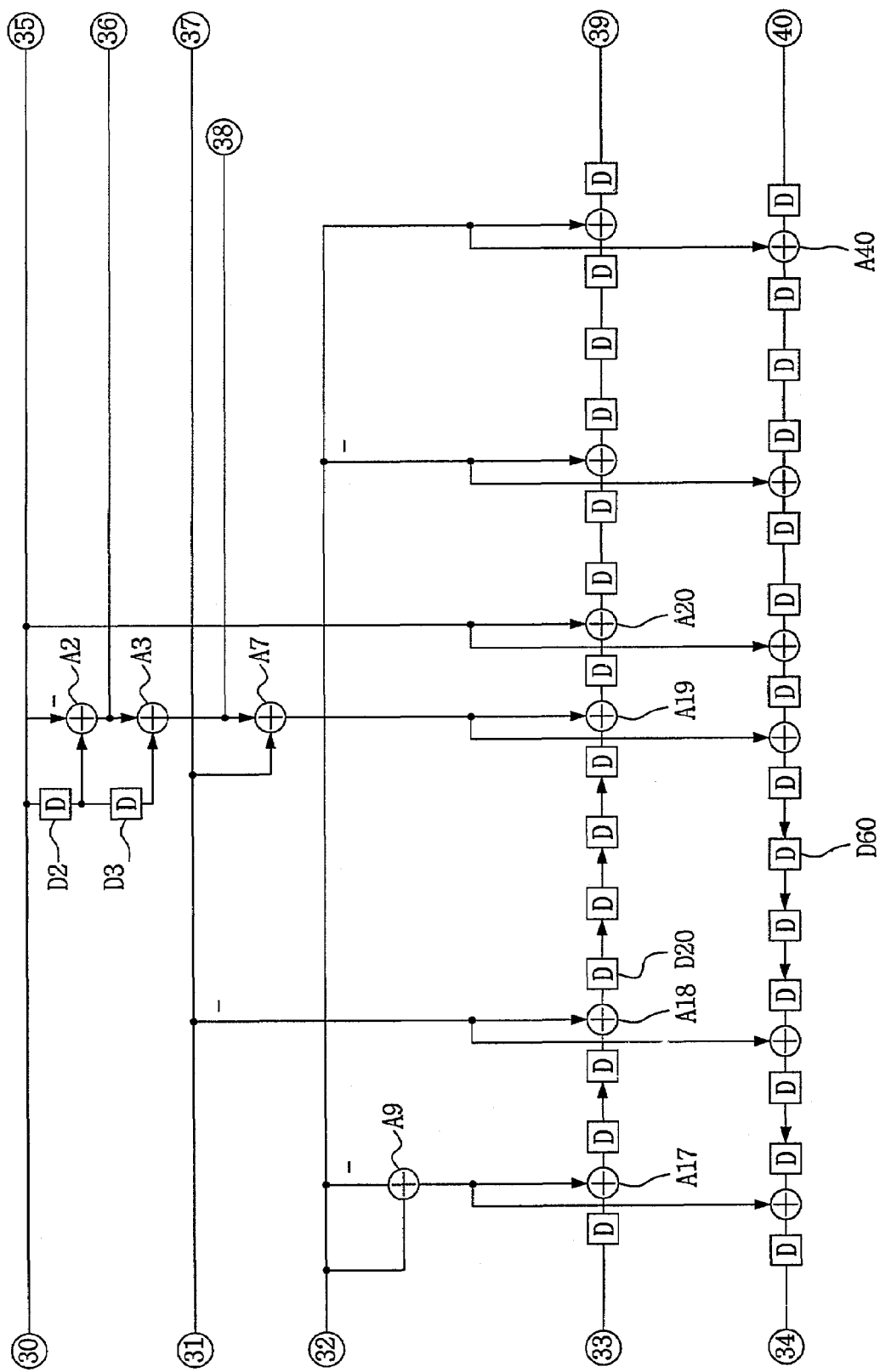
Figure 6C:
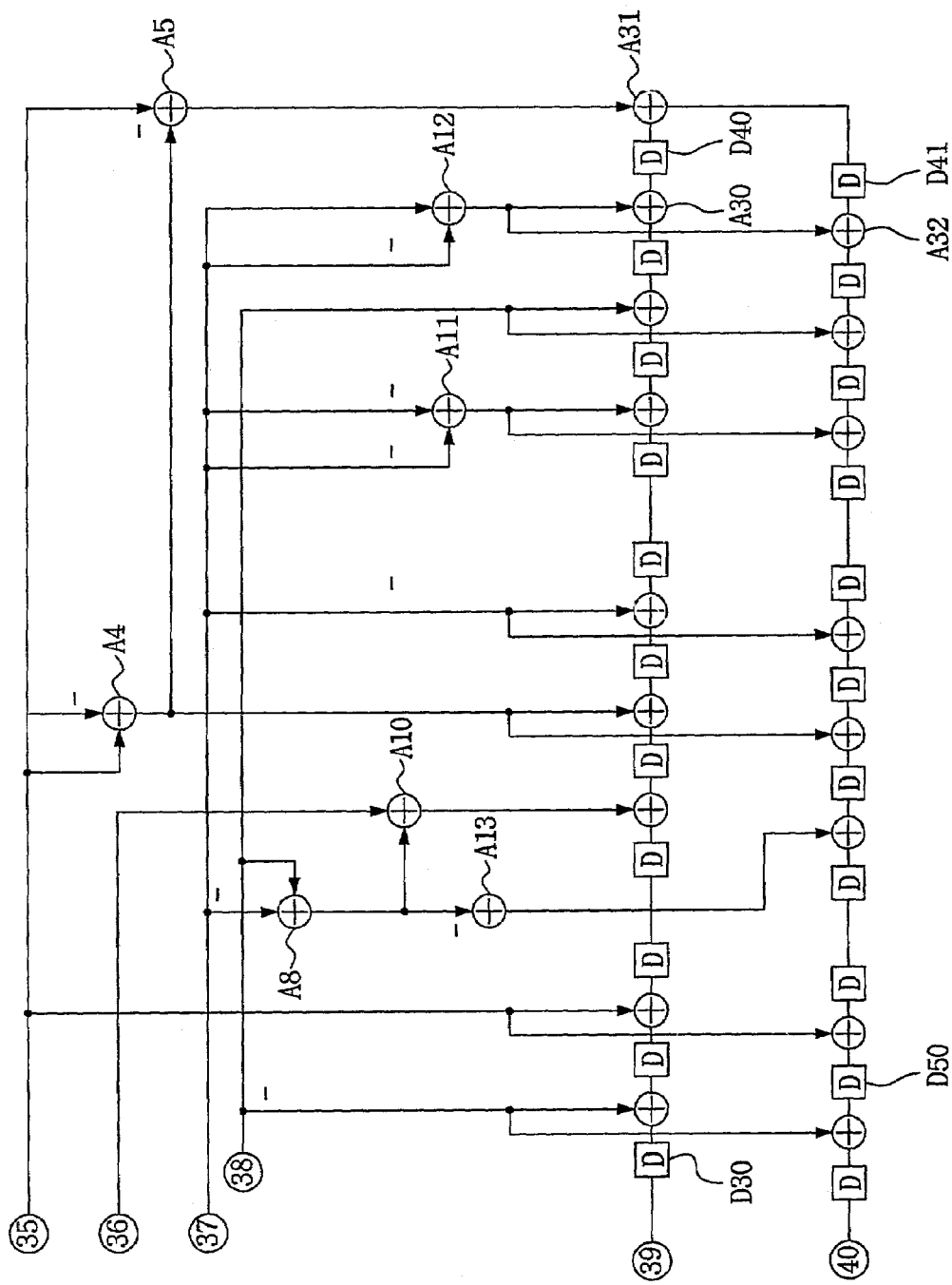

FIGS. 6A, 6B and 6C show configurations of a 10-bit CSD linear phase filter implemented with the vertical common subexpressions in Table 8. FIGS. 5A and 5B show configurations of a 10-bit CSD linear phase filter implemented with the horizontal common subexpressions in Table 7. The filter of FIG. 5 requires 74 adders, while the filter of FIG. 6 requires 49 adders. Thus, the vertical common subexpression method of present invention accomplishes a reduction of 33.8% in the number of adders.

Table 9 shows the number of adders for implementing 9 bits to 16 bits in Table 4 when coefficients of the bits is respectively implemented with a conventional horizontal common subexpression method and a vertical common subexpression method of the present invention. As shown in Table 9, the number of adders implemented with the vertical common subexpression method is less than the number of adders implemented with the horizontal common subexpression method. The vertical common subexpression method according to the present invention can achieve higher efficiency in implementing the less number of bits.

TABLE 9

Reduction ratio in the number of adders of a vertical common subexpression relative to a conventional method (73 taps)

| | Conventional horizontal common subexpression | Present invention Vertical common subexpression | saving (%) |
|---|---|---|---|
| 9 bit | 62 | 40 | 35.5 |
| 10 bit | 74 | 49 | 33.8 |
| 11 bit | 81 | 63 | 22.2 |
| 12 bit | 93 | 75 | 19.4 |
| 13 bit | 93 | 83 | 10.6 |
| 14 bit | 101 | 96 | 5 |
| 15 bit | 107 | 100 | 6.5 |
| 16 bit | 116 | 111 | 4.3 |

According to another embodiment of the present invention, a specification of a CDMA IS-95 intermediate frequency terminal (that is suggested by Qualcomm) was implemented with a vertical common subexpression method of the present invention. Here, a sampling frequency of a digital filter was 19.6608 MHz, a pass band frequency and an amount of damping were 630 KHz and 0.1 dB, and a stop band frequency and an amount of damping were 820 MHz and −40 dB, respectively. A filter was designed using the MATLAB FIR filter design tool to meet the specification, so that the linear phase filter coefficients of 219 taps were achieved. 110 coefficients except 109 symmetric coefficients out of the total 219 filter coefficients were converted into 2's complement type of 20 bits and thereafter were represented with CSD type coefficients.

Table 10 respectively shows the number of adders for implementing 9 bits to 16 bits in Table 4 when coefficients of the bits is respectively implemented with a conventional horizontal common subexpression method and a vertical common subexpression method of the present invention. As shown in Table 10, the reduction ratio in the number of adders is greater when the number of bits is smaller.

TABLE 10

Reduction ratio in the number of additions of vertical common subexpression relative to a conventional method (219 taps)

| | Conventional horizontal common subexpression | Vertical common subexpression | Saving (%) |
|---|---|---|---|
| 9 bit | 108 | 56 | 48.15 |
| 10 bit | 153 | 80 | 47.71 |
| 11 bit | 203 | 116 | 44.76 |
| 12 bit | 223 | 136 | 39.01 |
| 13 bit | 226 | 172 | 27.12 |
| 14 bit | 248 | 193 | 22.18 |
| 15 bit | 270 | 227 | 15.93 |
| 16 bit | 288 | 244 | 15.28 |

In summary, when the filter coefficients of 9 bits to 16 bits (in Table 4) were implemented by the CSD linear phase FIR filter having 73 taps (Table 9), a reduction ratio in the number of adders of the vertical common subexpression method (using 77 adders) relative to the conventional horizontal common subexpression method (using 91 adders) was 15.3%. When the filter coefficients of 9 bits to 16 bits were implemented by the CSD linear phase FIR filter having 219 taps (Table 10), a reduction ratio in the number of adders of the vertical common subexpression method (using 153 adders) relative to the conventional horizontal common subexpression method (using 215 adders) was 28.84%. The average reduction ratio in the number of adders of the vertical common subexpression method of the present invention relative to the conventional horizontal common subexpression method was 22.11%. The performance of the vertical common subexpression method of the present invention was higher at a higher order filter (that is, the filter having 219 taps) than a lower order filter (that is, the filter having 73 taps). Further, the vertical common subexpression method according to the present invention may be employed in a general filter as well as in a linear phase FIR filter.

As described above, although the illustrative embodiments have been described herein with reference to the accompanying drawings, it is to be understood that the present invention is not limited to those precise embodiments, and that various changes and modifications may be affected therein by one of ordinary skill in the pertinent art without departing from the scope or spirit of the present disclosure. All such changes and modifications are intended to be included within the scope of the present disclosure as set forth in the appended claims. For example, the number of filter tap lines and the vertical common subexpressions may be changed or modified or reduced or added depending on the objects of the invention, and vertical common subexpressions and horizontal common subexpressions may be combined therein to implement filter coefficients. In addition, shift registers, adders and delayers may be implemented in software with microprocessors or digital signal processors as well as in hardware.

What is claimed is:

1. A method for implementing filter coefficients in a linear phase digital filter in which CSD (Canonical Signed Digit) filter coefficients are used as filter coefficients, and the CSD filter coefficients are expressed with CSD code words in a predetermined number of bits, comprising the steps of:
    determining vertical common CSD code words between corresponding CSD code words of adjacent filter coefficients, wherein a vertical common CSD code word in a highest level bit of the vertical common CSD code words is set as a vertical common subexpression;
    expressing the vertical common CSD code words out of the CSD code words of each filter coefficient with the vertical common subexpression by shifting and delaying the vertical common subexpression; and
    synthesizing the expressed vertical common CSD code words of the filter coefficients.

2. The method of claim 1, wherein the vertical common CSD code words comprise at least one of 1n, 11, 111, 1 n1, or 11nn.

3. The method of claim 1, wherein the vertical common CSD code words comprise at least one of n1, nn, nnn, n1n, and nn11.

4. The method of claim 1, wherein the linear phase digital filter comprises a linear phase FIR filter employed in a low band pass filter of a wireless sender/receiver terminal.

5. The method of claim 1, further comprising the step of setting an additional vertical common subexpression.

6. The method of claim 1, wherein the filter coefficients are implemented by using a FIR filter design tool.

7. A method for implementing a digital filter which comprises filter coefficients expressed with CSD (Canonical Signed Digit) code words of n bits (n is a natural number greater than or equal to 2) for filtering digital samples of k bits (k is a natural number greater than or equal to 4), comprising the steps of:
    generating a vertical common subexpression by searching vertical common CSD code words between corresponding CSD code words of adjacent filter coefficients and determining a vertical common CSD code word in a highest-level bit of the vertical common CSD code words as the vertical common subexpression; and
    converting the vertical common CSD code words out of each filter coefficient to a shifted and delayed vertical common subexpression such that the filter coefficients are synthetically implemented.

8. The method of claim 7, wherein the vertical common CSD code words comprise at least one of 1n, 11, 111, 1n1, and 11nn in a vertical direction of increasing the number of taps of delay lines in the digital filter.

9. The method of claim 7, wherein the vertical common CSD code words comprise at least one of n1, nn, nnn, n1n, and nn11 in a vertical direction of increasing the number of taps of delay lines in the digital filter.

10. A linear phase digital filter using CSD (Canonical Signed Digit) filter coefficients expressed with CSD code words of a given number of bits as filter coefficients at taps of delay lines, comprising:
    a vertical common subexpression generator, connected to a data input terminal, for setting a vertical common CSD code word in a highest level bit of vertical common CSD code words as a vertical common subexpression if corresponding CSD code words of adjacent filter coefficients have a plurality of the vertical common CSD code words;
    a shift register comprising a plurality of shifters commonly connected to an output terminal of the vertical common subexpression generator, each shifter shifting the output of the vertical common subexpression generator by a predetermined number of bits different from each other;
    a plurality of adders, each adder being connected to one of the shifters; and
    a plurality of delayers, each delayer being alternatively connected to an output terminal of corresponding adder of the adders and for delaying the output of the corresponding adder by a unit time.

11. The digital filter of claim 10, wherein the predetermined number of bits shifted by the shifters is sequentially decreased.

12. The digital filter of claim 10, wherein the shift register comprises a 8-bit shifter, a 6-bit shifter, a 3-bit shifter, and a 1-bit shifter in serial.

13. The digital filter of claim 10, wherein the vertical common subexpression generator comprises a delayer connected to the data input terminal and an adder connected between the delayer and the shift register.

14. The digital filter of claim 10, further comprising additional shift registers, delayers, and adders for implementing the filter coefficients having no vertical common CSD code word.

15. A linear phase digital filter in which CSD (Canonical Signed Digit) filter coefficients expressed with CSD code words of a predetermined number of bits are used as filter coefficients at taps of delay lines, comprising:
    a plurality of vertical common subexpression generators, connected to a plurality of data input terminals respectively, for setting a vertical common CSD code word in a highest-level bit of vertical common CSD code words of adjacent filter coefficients as a vertical common subexpression, respectively;
    a plurality of shift registers, each shift register being commonly connected to an output terminal of corresponding one of the vertical common subexpression generators and comprising a plurality of output terminals for shifting and outputting an output of the corresponding vertical common subexpression generator by a predetermined number of bits different from each other;
    a plurality of adders connected to the plurality of output terminals of the shift registers, respectively; and
    a plurality of delayers alternatively connected to the adders and for delaying the output of the adders by a unit time, respectively.

16. The digital filter of claim 15, wherein each vertical common subexpression generator comprises a delayer connected to corresponding one of the data input terminals and an adder connected between the delayer and corresponding one of the shift registers.

17. The digital filter of claim 15, wherein the predetermined number of bits shifted by the shift registers is sequentially decreased.

18. A CSD (Canonical Signed Digit) type digital filter in which filter coefficients comprises CSD filter coefficients expressed with CSD code words of a predetermined number of bits, comprising:
- a vertical common subexpression generator comprising a delay member and an addition member connected to a data input terminal to assign a vertical common subexpression to a vertical common CSD code word in a highest-level bit of vertical common CSD code words of adjacent filter coefficients;
- a shift register, commonly connected to an output terminal of the addition member of the vertical common subexpression generator, comprising a plurality of output terminals for sequentially shifting and outputting an output of the addition member by a predetermined number of bits in order of a lowest level of bit;
- an addition circuit comprising a plurality of input terminals connected to the output terminals of the shift register, respectively; and
- a delay circuit comprising a plurality of delayers alternatively connected to the input terminals of the addition circuit for delaying the output of the addition circuit by a unit time, respectively.

* * * * *